United States Patent
Cicalo et al.

(10) Patent No.: US 9,236,343 B2
(45) Date of Patent: Jan. 12, 2016

(54) ARCHITECTURE OF SPARE WIRING STRUCTURES FOR IMPROVED ENGINEERING CHANGE ORDERS

(71) Applicant: BLACKCOMB DESIGN AUTOMATION INC., Vancouver (CA)

(72) Inventors: James Cicalo, Burnaby (CA); Peter Hallschmid, Vancouver (CA); A. K. M. Kamruzzaman Mollah, Port Moody (CA)

(73) Assignee: BLACKCOMB DESIGN AUTOMATION INC., Vancouver (CA)

( * ) Notice: Subject to any disclaimer, the term of this patent is extended or adjusted under 35 U.S.C. 154(b) by 0 days.

(21) Appl. No.: 14/270,267

(22) Filed: May 5, 2014

(65) Prior Publication Data

US 2014/0332979 A1 Nov. 13, 2014

Related U.S. Application Data

(60) Provisional application No. 61/819,519, filed on May 3, 2013, provisional application No. 61/830,556, filed on Jun. 3, 2013.

(51) Int. Cl.
  *H01L 23/528* (2006.01)
  *H01L 23/525* (2006.01)
  *H01L 23/48* (2006.01)
(52) U.S. Cl.
  CPC ............ *H01L 23/525* (2013.01); *H01L 23/481* (2013.01); *H01L 23/528* (2013.01); *H01L 2924/0002* (2013.01)
(58) Field of Classification Search
  None
  See application file for complete search history.

(56) References Cited

U.S. PATENT DOCUMENTS

| | | | |
|---|---|---|---|
| 5,892,249 A | 4/1999 | Courtright et al. | |
| 6,307,162 B1 | 10/2001 | Masters et al. | |
| 6,404,226 B1 * | 6/2002 | Schadt | 326/41 |
| 6,586,961 B2 * | 7/2003 | Chaisemartin | 326/10 |
| 6,600,341 B2 * | 7/2003 | Bingert et al. | 326/102 |
| 7,034,384 B2 * | 4/2006 | Tsai | 257/678 |
| 7,180,324 B2 | 2/2007 | Chan et al. | |
| 7,287,320 B2 | 10/2007 | Wang et al. | |

(Continued)

OTHER PUBLICATIONS

Ho, Kuan-Hsien, Yen-Pin Chen, Jia-Wei Fang, and Yao-Wen Chang. "ECO Timing Optimization Using Spare Cells and Technology Remapping." IEEE Transactions on Computer-Aided Design of Integrated Circuits and Systems 29.5 (2010): 697-710.*

(Continued)

*Primary Examiner* — Joseph Schoenholtz
(74) *Attorney, Agent, or Firm* — Drinker Biddle & Reath LLP

(57) ABSTRACT

An integrated circuit includes a substrate having a plurality of electronic devices, a plurality of interconnect layers disposed on one or both sides of the substrate, and a plurality of active electrically conductive interconnect layer structures. The plurality of interconnect layers include horizontal interconnect and vertical-interconnect-access (VIA) layers. The plurality of active electrically conductive interconnect layer structures are disposed on at least one of the plurality of interconnect layers and electrically coupled with at least one of the plurality of electronic devices. The integrated circuit also includes a plurality of spare electrically conductive interconnect layer structures disposed on at least one of the plurality of interconnect layers and electrically isolated from the plurality of active electrically conductive interconnect layer structures.

33 Claims, 13 Drawing Sheets

(56) References Cited

U.S. PATENT DOCUMENTS

| | | | |
|---|---|---|---|
| 7,508,238 B2 | 3/2009 | Yamagami | |
| 8,134,187 B2 | 3/2012 | Vacula et al. | |
| 8,166,439 B2 * | 4/2012 | Hopkins et al. | 716/122 |
| 8,191,025 B1 | 5/2012 | Chan et al. | |
| 8,307,325 B2 | 11/2012 | Yamaoka | |
| 8,635,577 B2 * | 1/2014 | Kazda et al. | 716/130 |
| 8,689,163 B2 | 4/2014 | Kim et al. | |
| 2013/0191796 A1 * | 7/2013 | Chen et al. | 716/55 |

OTHER PUBLICATIONS

Chang, K.H., et. al. "Reap what you sow: Spare Cells for Post Silicon Metal Fix", Proceeding ISPD '08 International Symposium of Physical Design, (2008), pp. 103-110.Cad.*

"Encounter Conformal ECO Designer" downloaded from URL<http://www.cadence.com/products/Id/eco_designer/pages/default.aspx> on Jan. 27, 2015.*

* cited by examiner

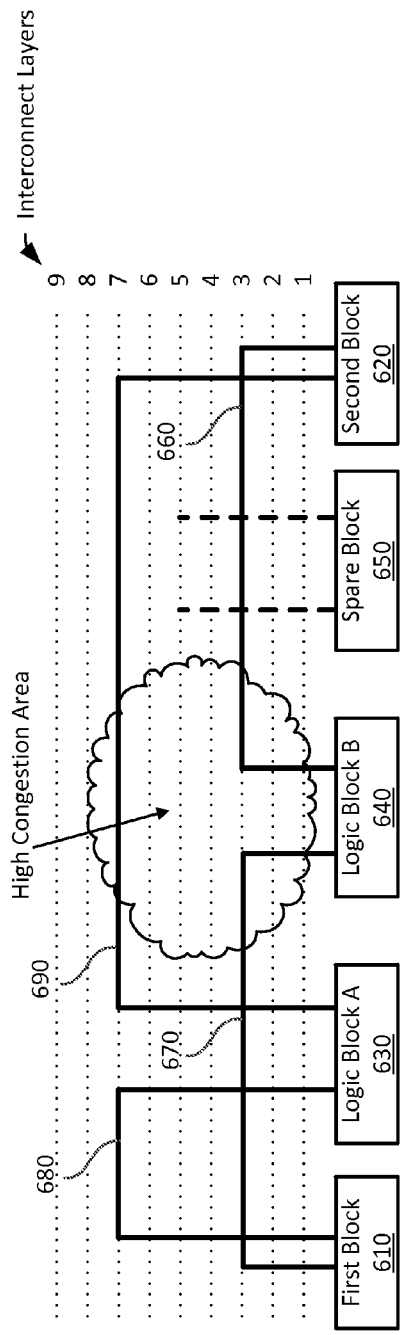
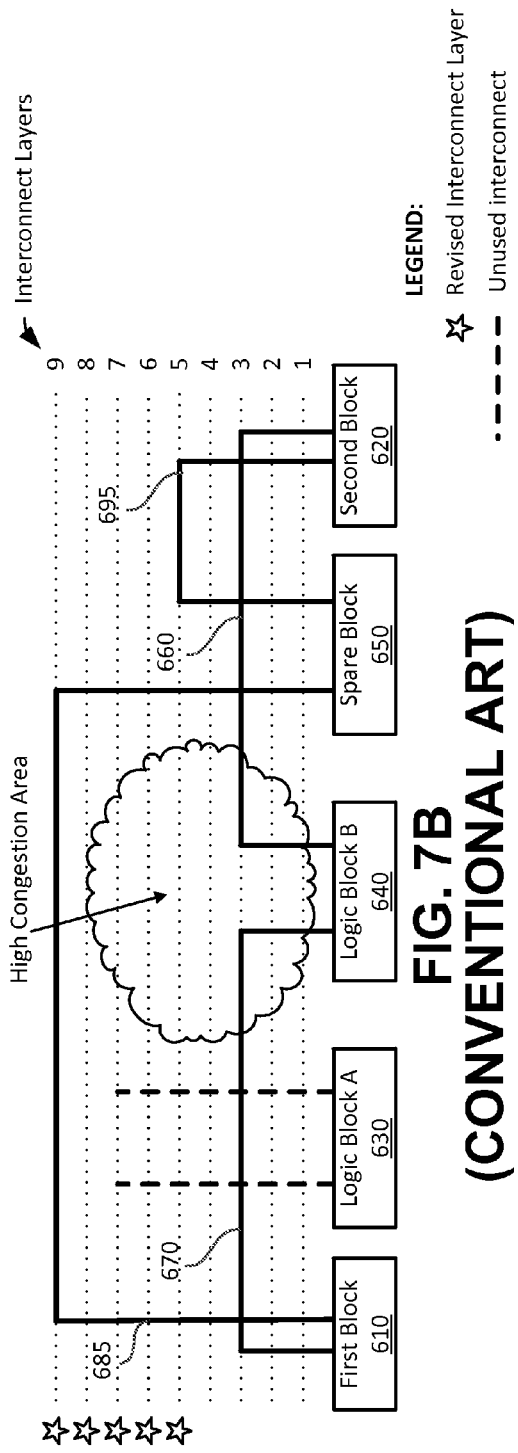
FIG. 7A (CONVENTIONAL ART)
FIG. 7B (CONVENTIONAL ART)

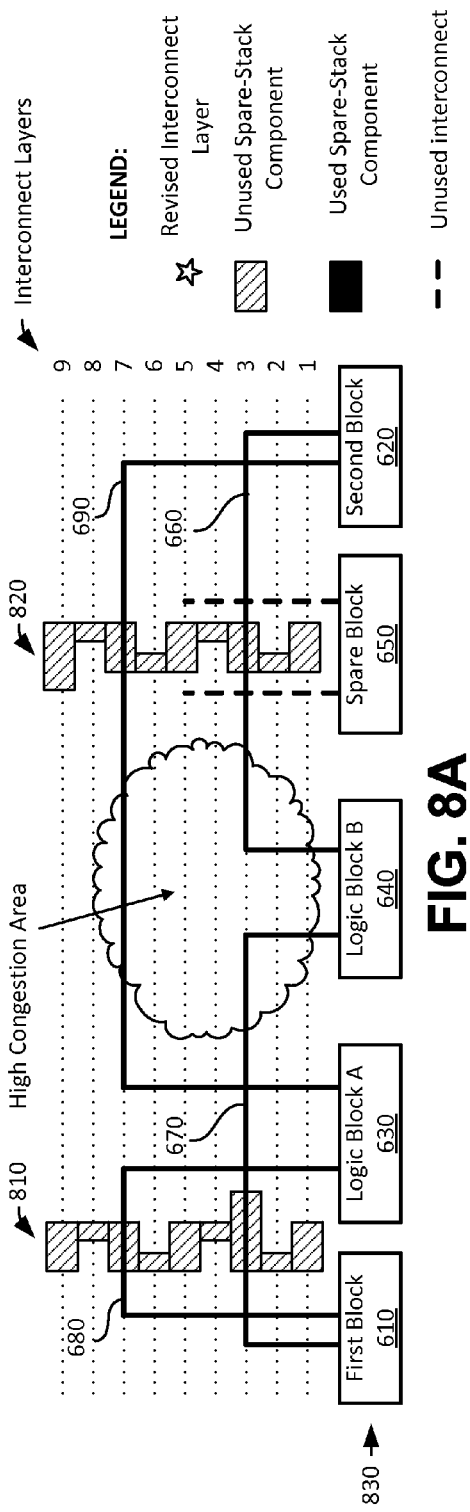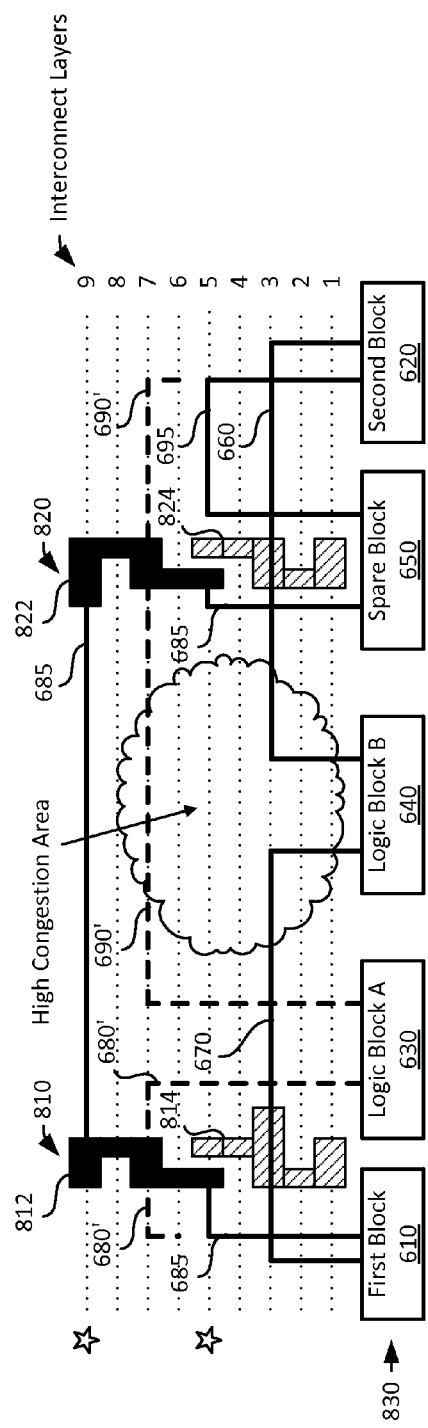
FIG. 8A
FIG. 8B

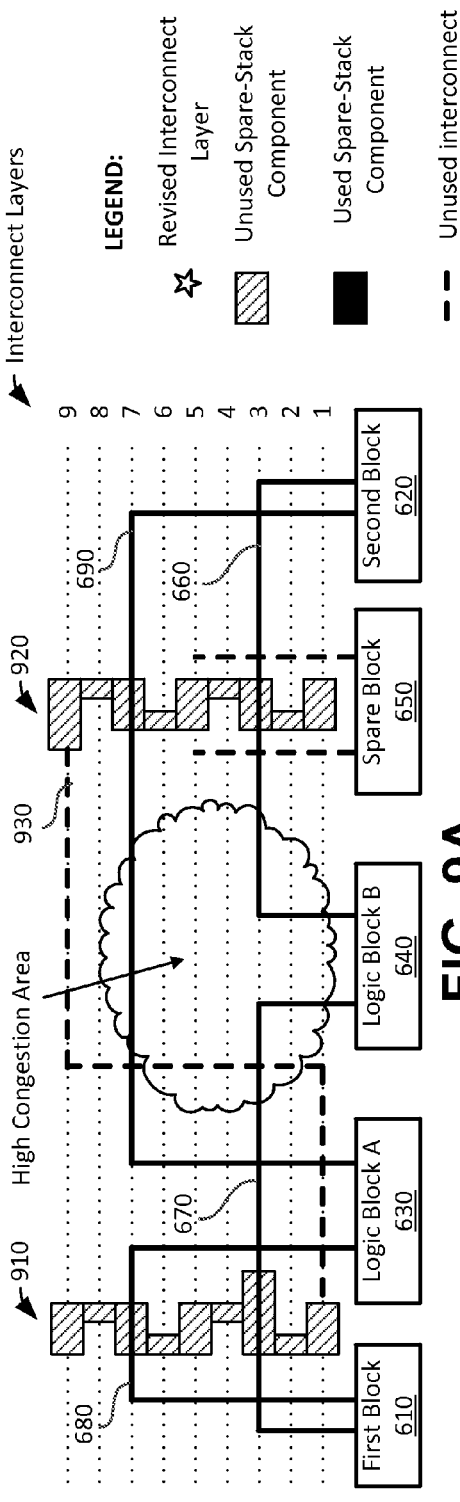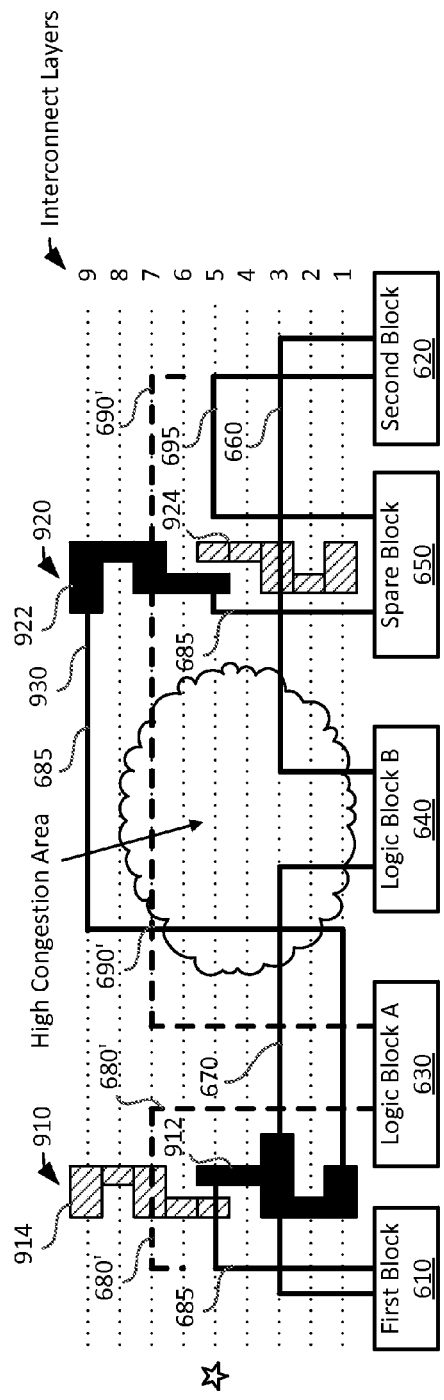
FIG. 9A
FIG. 9B

ARCHITECTURE OF SPARE WIRING STRUCTURES FOR IMPROVED ENGINEERING CHANGE ORDERS

RELATED APPLICATIONS

This application claims the priority benefits of U.S. Provisional Patent Application No. 61/819,519, entitled "Architecture of Spare Wiring Structures for Improved Engineering Change Orders" and filed on May 3, 2013, in the U.S. Patent and Trademark Office, and U.S. Provisional Patent Application No. 61/830,556, entitled "Method and System for the Insertion of Spare Routing Resources for Engineering Change Orders in Integrated Circuits," and filed on Jun. 3, 2013, the disclosures of both which are incorporated herein in their entirety by reference.

BACKGROUND

1. Field

The field of the embodiments generally relates to improved techniques and architectures for modifying the physical design and realization of integrated circuits, and more specifically to an architecture of spare wiring structures for improved engineering change orders.

2. Related Art

Integrated circuit design typically involves a series of well-defined steps using a sequence of electronic-design-automation (EDA) or computer aided design (CAD) tools. In a first step, the required functionality of the design is typically specified using a hardware description language (HDL) or by drawing a schematic with a graphical entry tool. Regardless of the mechanism used to specify the design, the design is converted to a netlist of logic elements through a step known as synthesis by an EDA software tool. The synthesis tool specifies the design as a netlist of circuit elements in a way that optimizes the design as specified using user-supplied constraints. These constraints may include optimizing for a desired operating speed, implementation area, or power-efficiency, etc. Given that the post-synthesis netlist meets the desired optimization requirements, an EDA tool then derives a silicon layout of the design netlist through a series of steps called placement, clock-tree synthesis, timing optimization, and routing. The outcome of the layout process is the physical design of the integrated circuit.

After the physical design of the integrated circuit has been generated through the layout design-automation tool, it is used to build a photomask set with each photomask being used for a separate photolithographic step during manufacture of the integrated circuit. The costs associated with the production of each photomask and the set as a whole is a significant part of the total cost of fabricating an integrated circuit.

If there are design errors or specification changes found after the photomask set has been manufactured, one or more of the photomasks must be redesigned and remanufactured. Changes are first made to the netlist and physical design before the relevant replacement photomasks are manufactured. The process of modifying or updating a design in such a way is referred to as an engineering change, an engineering change order, or in short as an ECO. To reduce costs, it is typically desirable to perform engineering change orders such that the desired change in design functionality or the physical realization is achieved while altering as few photomasks as possible, especially those photomasks that are more expensive to manufacture.

If an engineering change requires the refabrication of too many photomasks, the increased manufacturing costs, schedule delays, and risks associated with the engineering change may warrant a full revision, in which case the entire photomask set must be redesigned and remanufactured. The feasibility of an engineering change is a determination of whether or not an engineering change is possible without the need for modifying all photomasks, otherwise known as a full revision.

SUMMARY

According to an embodiment, an integrated circuit comprises: a substrate including a plurality of electronic devices; a plurality of interconnect layers disposed on one or both sides of the substrate, the plurality of interconnect layers including horizontal interconnect and vertical-interconnect-access (VIA) layers; a plurality of active electrically conductive interconnect layer structures disposed on at least one of the plurality of interconnect layers and electrically coupled with at least one of the plurality of electronic devices; and a plurality of spare electrically conductive interconnect layer structures disposed on at least one of the plurality of interconnect layers and electrically isolated from the plurality of active electrically conductive interconnect layer structures.

The plurality of spare electrically conductive interconnect layer structures may include at least one spare electrically conductive interconnect layer structure disposed on the at least one of the plurality of interconnect layers on which at least one of the plurality of active electrically conductive interconnect layer structures is disposed.

The integrated circuit may further comprise a spare-cell including an input/output interconnect electrically coupled with the spare-cell and disposed proximate to the at least one spare electrically conductive interconnect layer structure disposed on the at least one of the plurality of interconnect layers on which at least one of the plurality of active electrically conductive interconnect layer structures is disposed, there being no active electrically conductive interconnect layer structures between the input/output interconnect and the at least one spare electrically conductive interconnect layer structure along at least one path within at least one of the plurality of interconnect layers.

Each of the plurality of spare electrically conductive interconnect layer structures may be disposed at an access-location, the plurality of access-locations disposed in locations in the plurality of interconnect layers according to a calculated utility of providing access to the access-locations from a spare-cell.

Each of the plurality of spare electrically conductive interconnect layer structures may be disposed at an access-location, the plurality of access-locations disposed in locations in the plurality of interconnect layers according to a calculated utility of providing access from points of interest in the substrate including the plurality of electronic devices to one or more spare-cells or to other points of interest in the substrate.

Each of the plurality of spare electrically conductive interconnect layer structures may be disposed at an access-location, the plurality of access-locations disposed in locations in the plurality of interconnect layers according to a pattern to reduce complexity of an engineering change order of the integrated circuit.

The plurality of spare electrically conductive interconnect layer structures may be disposed in a corresponding plurality of locations of the plurality of interconnect layers according to at least one logical design characteristic of the integrated circuit selected from the group consisting of a measure of circuit centrality, circuit timing information, circuit switching or activity information, estimated demand for spare-resources, circuit complexity, circuit confidence level, circuit test coverage, and circuit importance when performing an engineering change order.

The plurality of spare electrically conductive interconnect layer structures may be disposed in a corresponding plurality of locations of the plurality of interconnect layers according to at least one physical design characteristic of the integrated circuit selected from the group consisting of active interconnect congestion, estimated supply of spare-resources, circuit timing information, circuit power information, active interconnect design information, and minimum transistor gate width.

The plurality of spare electrically conductive interconnect layer structures may pass through a high congestion area of the plurality of interconnect layers, the high congestion area of the plurality of interconnect layers having at least 10% greater number of active electrically conductive interconnect layer structures per unit area than an average number of active electrically conductive interconnect layer structures per unit area in the plurality of interconnect layers.

According to another embodiment, an integrated circuit comprises: a substrate including a plurality of electronic devices; a plurality of interconnect layers disposed on one or both sides of the substrate, the plurality of interconnect layers including horizontal interconnect and vertical-interconnect-access (VIA) layers; a plurality of active electrically conductive interconnect layer structures, each of the plurality of active electrically conductive interconnect layer structures disposed on one of the plurality of interconnect layers and electrically coupled with at least one of the plurality of electronic devices; and a spare-stack occupying a portion of more than one adjacent interconnect layer of the plurality of interconnect layers, the spare-stack including a plurality of spare electrically conductive interconnect layer structures electrically isolated from the plurality of active electrically conductive interconnect layer structures, the plurality of spare electrically conductive interconnect layer structures including at least one spare electrically conductive interconnect layer structure disposed on one of the plurality of interconnect layers on which at least one of the plurality of active electrically conductive interconnect layer structures are also disposed, the plurality of spare electrically conductive interconnect layer structures disposed on adjacent interconnect layers of the plurality of interconnect layers and electrically coupled with one another using one or more vias between pairs of the plurality of spare electrically conductive interconnect layer structures on adjacent interconnect layers.

A rectangular footprint of the spare-stack may be equal to or greater than two minimum line widths of the plurality of spare electrically conductive interconnect layer structures in each of two orthogonal directions.

A dimension of a rectangular footprint of the spare-stack may be less than half a distance to a closest neighboring access location in each of two orthogonal directions.

Each of the plurality of spare electrically conductive interconnect layer structures may adhere to a per horizontal-interconnect-layer rectangular footprint in each of two orthogonal directions, where the per horizontal-interconnect-layer footprint is disposed according to at least one physical design characteristic of the integrated circuit selected from the group consisting of active interconnect congestion, estimated supply of spare-resources, circuit timing information, circuit power information, active interconnect design information, and minimum transistor gate width.

The integrated circuit may further comprise a spare-cell electrically coupled with the spare-stack.

The integrated circuit may further comprise a plurality of spare-stacks, wherein each of the plurality of spare-stacks is disposed at an access-location, the plurality of access-locations disposed in locations in the plurality of interconnect layers according to a calculated utility of providing access from points of interest in the substrate including the plurality of electronic devices to one or more spare-cells or to other points of interest in the substrate.

The integrated circuit may further comprise a plurality of spare-stacks, wherein each of the plurality of spare-stacks is disposed at an access-location, the plurality of access-locations disposed in locations in the plurality of interconnect layers according to a pattern to reduce complexity of an engineering change order of the integrated circuit.

The integrated circuit may further comprise a plurality of spare-stacks, wherein the plurality of spare-stacks are disposed in a corresponding plurality of locations of the plurality of interconnect layers according to at least one logical design characteristic of the integrated circuit selected from the group consisting of a measure of circuit centrality, circuit timing information, circuit switching or activity information, estimated demand for spare-resources, circuit complexity, circuit confidence level, circuit test coverage, and circuit importance when performing an engineering change order.

The integrated circuit may further comprise a plurality of spare-stacks, wherein the plurality of spare-stacks are disposed in a corresponding plurality of locations of the plurality of interconnect layers according to at least one physical design characteristic of the integrated circuit selected from the group consisting of active interconnect congestion, estimated supply of spare-resources, circuit timing information, circuit power information, active interconnect design information, and minimum transistor gate width.

The one or more vias between pairs of the plurality of spare electrically conductive interconnect layer structures on adjacent horizontal-interconnect-layers may be two or more vias disposed between three or more of the plurality of spare electrically conductive horizontal-interconnect-layer structures on adjacent interconnect layers, and the two or more vias may not be vertically aligned with one another.

According to another embodiment, an integrated circuit comprises: a substrate including a plurality of electronic devices; a plurality of interconnect layers disposed on one or both sides of the substrate, the plurality of interconnect layers including horizontal interconnect and vertical-interconnect-access (VIA) layers; a plurality of active electrically conductive interconnect layer structures, each of the plurality of active electrically conductive interconnect layer structures disposed on one of the plurality of interconnect layers and electrically coupled with at least one of the plurality of electronic devices; and a spare-junction, the spare-junction comprising a plurality of spare-stacks, each of the plurality of spare-stacks occupying a portion of more than one adjacent interconnect layer of the plurality of interconnect layers, there being one or more unobstructed single-interconnect-layer routing paths between each pair of the plurality of spare-stacks comprised by the spare-junction for at least a prescribed number of interconnect layers, each of the plurality of spare-stacks including a plurality of spare electrically conductive interconnect layer structures electrically isolated from the plurality of active electrically conductive interconnect layer structures, the plurality of spare electrically conductive interconnect layer structures including at least one spare electrically conductive interconnect layer structure disposed on one of the plurality of interconnect layers on which at least one of the plurality of active electrically conductive interconnect layer structures are also disposed, the plurality of spare electrically conductive interconnect layer structures disposed on adjacent interconnect layers of the plurality of interconnect layers and electrically coupled with one another using one or more vias between pairs of the plurality of spare electrically conductive interconnect layer structures on adjacent interconnect layers.

The plurality of spare-stacks may be disposed in a corresponding plurality of locations of the plurality of interconnect layers according to at least one logic design characteristic of the integrated circuit selected from the group consisting of a measure of circuit centrality, circuit timing information, and estimated demand for spare-resources when performing an engineering change order.

The plurality of spare-stacks may be disposed in a corresponding plurality of locations of the plurality of interconnect layers according to at least one physical design characteristic of the integrated circuit selected from the group consisting of active interconnect congestion, estimated supply of spare-resources, and timing information.

The one or more vias between pairs of the plurality of spare electrically conductive interconnect layer structures on adjacent interconnect layers may be two or more vias disposed between three or more of the plurality of spare electrically conductive interconnect layer structures on adjacent interconnect layers, and the two or more vias may not be vertically aligned with one another.

The plurality of spare-stacks may be disposed in a corresponding plurality of locations of the plurality of interconnect layers according to a pre-defined rectangular footprint, where the plurality of spare-stacks are routed such that there exists one or more unobstructed single-interconnect-layer routing paths between each pair of the plurality of spare-stacks comprised by the spare-junction for at least a prescribed number of interconnect layers such that each of the routing paths is confined to the pre-defined rectangular footprint.

The pre-defined rectangular footprint of the spare-junction may be equal to or greater than the largest per horizontal-interconnect-layer minimum line width of the plurality of interconnect layers spanned by the spare-junction in each of two orthogonal directions.

A dimension of the pre-defined rectangular footprint of the spare-junction may be less than half a distance to a closest neighboring access location in each of two orthogonal directions.

The plurality of spare-stacks may be disposed in a corresponding plurality of locations of the plurality of interconnect layers according to a pre-defined maximum routing path length, where the plurality of spare-stacks may be routed such that there exists one or more unobstructed single-interconnect-layer routing paths between each pair of the plurality of spare-stacks comprised by the junction for at least a prescribed number of interconnect layers such that each of the routing paths is limited in length to the maximum routing path length.

A maximum path-length per interconnect layer of the spare-junction may be equal to or greater than a horizontal-interconnect-layer minimum line width of the plurality of interconnect layers spanned by the spare-junction in each of two orthogonal directions.

A maximum path-length per interconnect layer of the spare-junction may be less than or equal to a timing critical-path length of a local clock domain.

The plurality of spare-stacks may be disposed in a corresponding plurality of locations of the plurality of interconnect layers, where one or more of the plurality of locations of the plurality of interconnect layers may be determined according to pre-defined custom cells, where each custom cell defines a specific arrangement of pins for one of the plurality of horizontal-interconnect-layers through which the plurality of spare-stacks are routed, with each spare-stack being routed through a unique pin of the custom cell.

The integrated circuit may further comprise a plurality of spare-junctions, wherein each of the plurality of spare-junctions is disposed at an access-location, the plurality of access-locations disposed in locations in the plurality of interconnect layers according to a calculated utility of providing access from points of interest in the substrate including the plurality of electronic devices to one or more spare-cells or to other points of interest in the substrate.

The integrated circuit may further comprise a plurality of spare-junctions, wherein each of the plurality of spare-junctions are disposed at an access-location, the plurality of access-locations disposed in locations in the plurality of interconnect layers according to a pattern to reduce complexity of an engineering change order of the integrated circuit.

BRIEF DESCRIPTION OF THE DRAWINGS

These and/or other aspects will become apparent and more readily appreciated from the following description of the embodiments, taken in conjunction with the accompanying drawings in which:

FIGS. 7A and 7B are schematic diagrams that illustrate a conventional method of performing an engineering change order of an integrated circuit design according to the example change in logic connections of FIGS. 6A and 6B;

FIGS. 8A and 8B are schematic diagrams that illustrate a method of performing an engineering change order of an integrated circuit design according to the example change in logic connections of FIGS. 6A and 6B, using spare-stacks, according to an embodiment;

FIGS. 9A and 9B are schematic diagrams that illustrate a method of performing an engineering change order of an integrated circuit design according to the example change in logic connections of FIGS. 6A and 6B, using spare-stacks and spare-routes, according to an embodiment;

DETAILED DESCRIPTION

Figure 1:
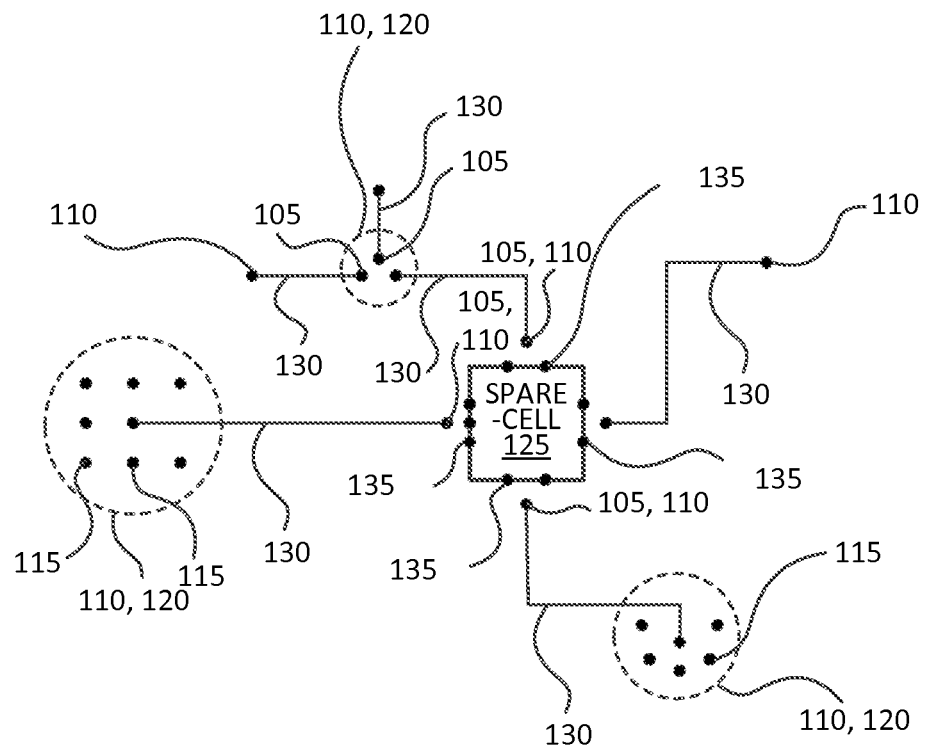
FIG. 1 is a schematic diagram that illustrates spare wiring structures employed in the vicinity of a spare-cell in an integrated circuit design, according to an embodiment.

Reference will now be made in detail to embodiments, examples of which are illustrated in the accompanying drawings, wherein like reference numerals refer to the like elements throughout.

According to various embodiments, an architecture for integrated circuits includes spare wiring structures that are inserted into the physical design of an integrated circuit in order to facilitate or improve the process of modifying one or more of the operation, function, and performance characteristics of the integrated circuit, either pre- or post-fabrication. Modification of the design of the integrated circuit to change its operation, function, and/or performance characteristics is known as an engineering change order (ECO) process, in which engineering changes (ECs) are made to an integrated circuit design. The architecture of spare wiring structures increases the accessibility from circuit elements to spare-resources and to other circuit elements within the integrated circuit for use in performing an ECO on the integrated circuit design.

The spare resources may include standard cell-based spare-cells or metal-configurable gate-array spare-cells. Hereinafter, where "spare-cells" are referred to, they are to be considered to include "spare-packs" as well, which may be a collection of spare-cells, a logic block that performs a function more specific than a spare-cell, or other spare circuit elements that can be used in the implementation of an ECO. The spare wiring structures may also increase the accessibility between locations within the integrated circuit that do not necessarily include spare-resources. The increased accessibility decreases the impact of ECOs on the physical implementation of an integrated circuit design, therefore resulting in less complex ECOs that are faster to implement and require fewer photomask changes.

Unlike embodiments of the architecture of spare wiring structures, prior approaches do not provide the ability to connect previously separate locations in the physical design of an integrated circuit using one or more of multiple possible interconnect layers, thereby offering an overall reduction in the number of modified photomasks. Unlike previous approaches, in embodiments of the architecture disclosed herein, the spare wiring structures can be incorporated into the physical design of an integrated circuit without the need to alter the implementation of the original circuit design. Improvement in the integrated circuit resulting from the embodiments can be measured using several metrics. One such metric is the increase in the number of feasible ECOs attributed to the inclusion of the spare wiring structures of the architecture. Embodiments of the architecture including spare wiring structures increase the number of feasible ECOs of a given integrated circuit design incorporating the embodiments. A second metric is the reduction in the number of modified photomasks when performing a set of ECOs for a given integrated circuit design that incorporates embodiments of the architecture including spare wiring structures. Embodiments of the architecture including spare wiring structures reduce the number of photomasks that must be modified when performing a set of ECOs for a given integrated circuit design incorporating the embodiments. A third metric is the reduction of engineering time and effort required to perform a set of ECOs for a given integrated circuit design that incorporates embodiments of the architecture including spare wiring structures. Embodiments of the architecture including spare wiring structures reduces the engineering time and effort required when performing a set of ECOs for a given integrated circuit design incorporating the embodiments.

The improvement can be attributed to the reduced impact of ECOs on the physical design of the integrated circuit due to the employment of the architecture including the spare wiring structures. The impact of an ECO can be determined by the extent to which the physical design of an integrated circuit must be modified in order to complete the ECO. The impact of an ECO may be reduced using embodiments of the architecture by systematically increasing the ability to connect previously separate locations in the physical design of an integrated circuit while requiring modification to fewer metal and via layers than would otherwise be required. This impact will likely be greater when there is a high degree of routing congestion (i.e., higher density of routing obstructions) near and in between the locations being connected, because higher congestion may require the routing path taken by the connecting wire to make use of a higher number of via and metal layers in order avoid obstructions. The modification of fewer metal layers may be required using the embodiments of the architecture by facilitating two non-adjacent metal layers to be electrically connected during the completion of an ECO without having to modify the metal and via layers that reside between the metal layers being connected. This may be achieved in some embodiments by inserting spare wiring structures into unused areas of the physical design. In other embodiments, this may be achieved by inserting spare wiring structures before non-spare cells are placed or before non-spare wires is inserted, thus possibly influencing the placement of non-spare cells and the routing of non-spare wires. These spare wiring structures may be utilized when performing an ECO to form one or more complete paths between two or more elements within the circuit design by modifying one or more photomasks. The modification of the photomasks would change the original electrical connections in the metal layers to use one or more spare wiring structures as part of the electrical connections between two or more elements within the circuit design.

The spare wiring structures include one or more of, but are not limited to, the following types:
- spare-routes (SR)
- spare-stacks (SS)
- floating spare-stacks (FSS)
- spare-junctions (SJ)

These structures include one or more of spare metal wires and spare vias, and are not electrically connected to the surrounding circuit design in an original circuit design before any engineering changes, but rather are only connected to the surrounding circuit design when used to perform an ECO. The spare metal wires used to implement a spare wiring structure may include as few as one or as many as all metal layers in the integrated circuit design. Similarly, the spare vias used to implement a spare wiring structure may include as few as one or as many as all via layers in the integrated circuit design.

Spare-routes are used for interconnect (e.g., connections between two or more elements of an integrated circuit design) when performing an ECO and at a minimum include a wire constructed using a single metal layer, and may include a wire that spans up to all metal and via layers of the integrated circuit design. Spare-routes may start or end in close proximity to spare-cell input or output pins, spare-cell input or output pin extensions, to another spare-route, or to one or more circuit elements of the physical circuit design. Spare-routes may be generally horizontally-oriented to run within the metal layers of the integrated circuit design from one area of an integrated circuit design to another area of the integrated circuit design.

Figure 2:
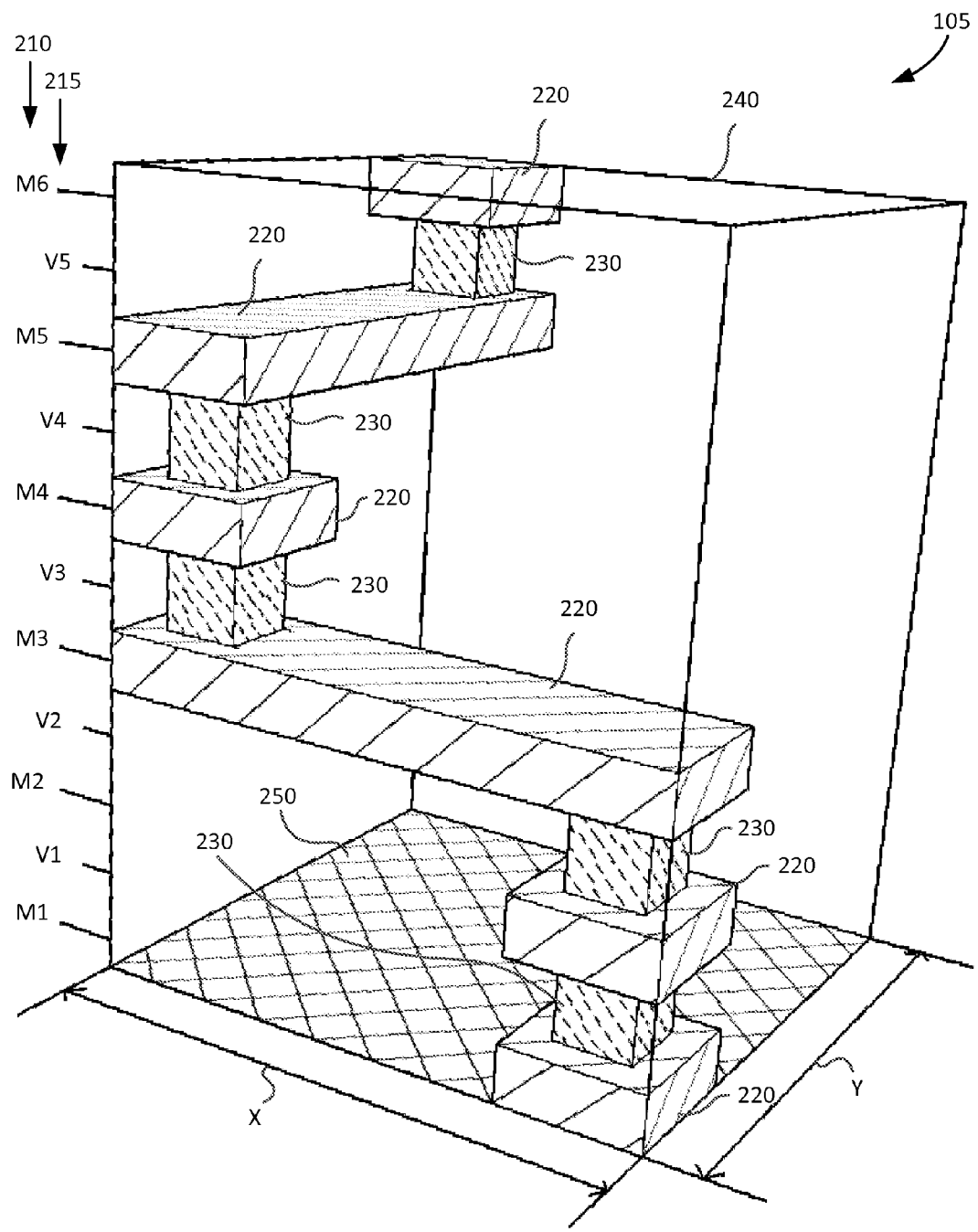
FIG. 2 is a perspective diagram that illustrates a spare-stack, a type of spare wiring structure, in a physical design of an integrated circuit, according to an embodiment.

In some embodiments, one or both ends of a spare-route are connected to a spare-stack, which is a wire that spans as many metal and via layers as possible within a prescribed footprint, as shown in FIG. 2, where the footprint is the area contained within the X and Y dimensions. Spare-stacks may be generally vertically-oriented to run between an upper metal layer and a lower metal layer within a single localized area of the integrated circuit design. Spare-stacks may be used as connection points between adjacent spare-routes, spare-cell inputs or outputs and spare-routes, or spare-routes and circuit elements of the surrounding physical design of an integrated circuit. In some embodiments, every spare-cell input and output is connected to either a spare-stack or a pin extension in order to provide connectivity on as many metal layers as possible. In other embodiments, spare-stacks may be left unconnected, herein referred to as "floating spare-stacks" (FSS).

A spare-junction exists where two or more spare-routes start or end within sufficient proximity of one another to facilitate the formation of a connection between the spare-routes by modifying no more than a predefined maximum number of photomasks. In some embodiments this predefined maximum number of photomasks is one, but the predefined maximum number of photomasks may be two, three, four, five, six, or more, in various other embodiments.

In various embodiments, spare wiring structures are inserted into the physical design of an integrated circuit in order to provide increased accessibility between a spare-cell and one or more other circuit elements at a given location or locations of interest in the integrated circuit. The spare wiring structures may also be inserted in order to provide alternative paths between other circuit elements in the integrated circuit that can be utilized when performing an ECO. The location or locations of interest of the one or more other circuit elements may be identified according to a plurality of methods, including but not limited to a predicted utility of providing a connection to a spare-cell for the purpose of performing an ECO. These locations are herein referred to as "Access Locations" (ALs). In order to maximize the number of access locations for a given spare-cell, a spare-route originating from within the vicinity of a spare-cell input or output may end in the vicinity of one or more other spare-routes, which in turn may end in the vicinity of additional spare-routes that eventually terminate in an access location. For some embodiments, ALs may include spare-cells pin locations. Spare-stacks may additionally be left unconnected as "floating spare-stacks" (FSS), and placed at one or more pre-selected regions of the physical design of the integrated circuit as determined by one of either a designer using a computer-aided design (CAD) software tool or environment, or the CAD software environment. These floating spare-stacks may be used to achieve a further increase in the accessibility of spare-cells within an integrated circuit by increasing the number of potential connection points to an access location through a reduction in the number of photomasks that would otherwise require a modification in order to construct the connection.

In order to perform an ECO, typically one or more complete paths are constructed between two or more different locations of the physical circuit design, where one or more of the locations may include a spare-cell input or output. In a conventional ECO, a complete path may traverse several or all available metal layers, and the entire path is constructed at the time the ECO is performed. In contrast, in embodiments of the spare wiring structure architecture, one or more segments of the complete path of a potential future ECO are proactively inserted into the physical implementation of the original design in order to reduce the number of photomasks that must be modified when the future ECO is performed. In this scenario, the segments are implemented as spare-routes, and a complete path may consist of one or more of the following connection types:

A. Spare-cell input pin or output pin connected to a spare-route
    B. Spare-route connected to another spare-route
    C. Spare-route connected to the physical circuit design
    D. Spare-route connected to a spare-stack
    E. Spare-route connected to a floating spare-stack
    F. Floating spare-stack connected to the physical circuit design In many embodiments, connection types A and B can be constructed by only modifying the photomask used to fabricate a single metal layer. The choice of metal layer that is used to construct the connection may be limited to a single specific metal layer or may include all metal layers used in the physical design. The number of metal layers that can be independently used to construct the connection is determined by the presence or absence of routing obstructions between adjacent spare-stacks on each metal layer. Such connections may also be formed between a spare-cell input or output and either a spare-route or a spare-stack between which there is an absence of routing obstructions on at least one metal layer. Such connections may additionally be formed between adjacent spare-routes between which there is an absence of routing obstructions on at least one metal layer. The remaining connection types (C, D, E, and F) may require the modification of more than one metal layer depending upon the physical circuit design and one or more of the topology and placement of the spare wiring structures.

The proximity of spare wiring structures (e.g., spare-routes and spare-stacks) to one another is considered to be sufficient to prevent a routing obstruction on all metal layers when there is an absence of routing obstructions within at least one metal layer that prevent routing from one to the other on that metal layer. In various embodiments, this proximity may be measured in terms of minimum line widths of a fabrication technology, such as 100 nm, 45 nm, 32 nm, 22 nm, or other line widths of different fabrication technologies in which the integrated circuit design may be fabricated. For example, in various embodiments, the proximity may be sufficient if it is one, two, three, four, five, or more line widths and there are no lines or vias that obstruct routing within a single metal layer. This proximity may also be measured in terms of nanometers, where the relationship between nanometers and line widths is defined by the fabrication technology in which the integrated circuit design is to be fabricated.

In some embodiments, a signal regenerator, buffer component, or a dummy load is inserted in a spare-route at some point in the complete path in order for the route to meet timing requirements of a design in the event the spare-route is used to perform an ECO.

In some embodiments, a spare wiring structure is used strictly to decrease or increase the length of a connection between two parts of the active design to meet timing requirements.

FIG. 1 is a schematic diagram that illustrates spare wiring structures employed in the vicinity of a spare-cell 125 in an integrated circuit design, according to an embodiment. In this example embodiment, spare-stacks 105 are inserted at access-points that are in close proximity to the input and output pins 135 of the spare-cell 125. Spare-routes 130 connect predetermined areas known as "access locations" (ALs). These access locations can be located in close proximity to a spare-cell 125 or to locations 110 that have been determined to be points of interest due to some perceived or calculated utility of providing access to these locations from other integrated circuit design elements or from spare-cells 125. In some embodiments, a spare-route 130 includes a spare-stack 105 on one or both ends of the spare-route 130. In other embodiments, a spare-route 130 may terminate on either end without a spare-stack 105 attached thereto. Each access location 110 may also include a spare-stack 105 or a spare-junction 120. A single spare-route 130 may connect to one of several other spare-routes 130 by means of a spare-junction 120, which provides the ability to connect adjacent spare-routes 130 through the modification of a single interconnection layer between two spare-stacks 105 that are connected to the spare-routes 130. The same principle is used to facilitate the connection between a single spare-route 130 and one of several spare-cell input or output pins 135 of the spare-cell 125. Additional floating spare-stacks 115 may be inserted in the vicinity of an access location 110 in order to increase the number of potential circuit locations that can possibly be connected to the relevant spare-route 130. These floating spare-stacks 115 are completely unconnected electrically from both the circuit design and other spare wiring structures when they are inserted into the physical design of the integrated circuit, and are therefore known are "floating spare-stacks".

FIG. 2 is a perspective diagram that illustrates a spare-stack 105, a type of spare wiring structure, in a physical design of an integrated circuit, according to an embodiment. FIG. 2 illustrates a conceptual view of one exemplary configuration of the spare-stack 105 using more than two horizontal interconnect layers 210. In this exemplary embodiment, the spare-stack 105 includes six horizontal interconnect layers 210 (M1-M6), which may be metallic, and five vertical interconnect access (VIA) layers 215 (V1-V5), each of which is disposed between two adjacent horizontal interconnect layers. While the embodiments are described herein as using metal for the interconnect material in the horizontal interconnect layers, this should not be construed as limiting. In various embodiments, according to the fabrication technology in which the integrated circuit is fabricated, the horizontal or vertical interconnect material may comprise other electrically conductive materials, e.g., non-metallic electrically conductive materials. Thus, a "wire" as disclosed herein may be either metallic or comprise a non-metallic conductive material.

The horizontal interconnect 220 and vias 230 are joined together in order to construct a single wire that spans as many horizontal interconnect layers 210 and via layers 215 as possible within a prescribed footprint 250. The prescribed footprint 250 is shown in FIG. 2 as the two-dimensional area of dimensions X and Y. This prescribed footprint 250 forms a plane that is parallel to the fabrication layers of the integrated circuit, e.g., the semiconductor substrate. The prescribed footprint 250 may be restricted to a maximum area, which may be as large as the area occupied by the entire physical design of the integrated circuit, or may be as small as the area occupied by a single via 230 of minimum size connected to two horizontal interconnects 220 also of minimum size (e.g., minimum line width), where the interconnect layers 210 and via layers 215 are selected as those having the smallest allowable dimensions among the set of possible interconnect layers 210 (M1-M6) and via layers 215 (V1-V5) for the fabrication process that is employed. For example, the prescribed footprint 250 may be one, two, three, four, five, or more minimum line widths of the fabrication technology in which the integrated circuit is to be fabricated. The minimum line width of an interconnect 220 may depend upon which horizontal interconnect layer 210 the interconnect 220 is positioned. Thus, the prescribed footprint 250 may be equal to or greater than one, two, three, four, five, or more times the largest per-horizontal-interconnect-layer minimum line width of the horizontal interconnect layers 210 spanned by the spare-stack 105. Alternatively, each dimension (i.e., X and Y) of the prescribed footprint 250 may have at least one of a prescribed maximum value and a prescribed minimum value, and these values for one dimension may not equal the values for the other dimension.

The prescribed footprint 250 combined with the number of contiguous interconnect layers 210 and via layers 215 defines a spare-stack region 240. The spare-stack region 240 includes all the interconnects 220 and vias 230 that may be electrically connected to form a wire across one or more interconnect layers 210 that may be used to implement an ECO using the spare-stack 105. The height or thickness of the spare-stack region 240 may be computed as the thickness of a horizontal interconnect layer 210 times the number of horizontal interconnect layers 210 included in the spare-stack region 240, plus the height of a via layer 215 times the number of via layers 215 included in the spare-stack region 240. The height or thickness of the spare-stack region 240 may also be specified as the number of horizontal interconnect layers 210 and via layers 215 included in the spare-stack region 240.

The spare-stack 105 may be configured with offset vias 230 and interconnects 220 within the spare-stack region 240 as illustrated so that vias 230 are not placed directly over one another. By offsetting the vias 230, a portion of a spare-stack 105 that remains unused after an ECO (e.g., is not connected to an active circuit of the integrated circuit design after the ECO is completed) remains available to be used in a future ECO. Offsetting the vias 230 makes it more efficient to disconnect an upper portion of the spare-stack 105 from a lower portion of the spare stack 105. In addition, if the spare-stack 105 is connected to VDD or VSS (or power or ground) through a tie-cell, then the electrical connection between a signal path and VSS/VDD can be broken while still ensuring that the via 230 closest to the disconnection point of the spare-stack 105 has enough metal or interconnect material surrounding it in order to meet design rule checking (DRC) rules of the manufacturing process in which the integrated circuit is to be fabricated.

In some embodiments, no interconnect of an original integrated circuit design may pass through a spare-stack region 240, reserving the spare-stack region 240 for use in performing an ECO, for example when the spare-stack region 240 includes a floating spare stack. In other embodiments, the spare-stack region 240 may include one or more interconnects of an original integrated circuit design, while the interconnects 220 and vias 230 of the spare-stack 105 are laid out and interconnected with one another within the spare-stack region 240 to navigate around the one or more interconnects of the original integrated circuit design. In these latter embodiments, an original integrated circuit design including embodiments of the architecture of spare wiring structures may achieve higher density by placing spare-stacks 105 in areas where there are no minimum line width prescribed footprints 250 that are open without interconnects through all interconnect layers 210 and via layers 215, or a sufficient number of interconnect layers 210 and via layers 215 to meet the objectives of placing a wire across multiple interconnect layers 210 and via layers 215 to connect a spare-route 130 or spare-cell 125 when performing an ECO.

As illustrated, each interconnect layer 210 within the spare-stack region 240 includes an interconnect 220. In at least one interconnect layer 210, the interconnect 220 may be generally oriented to run along the X dimension across the full X dimension width of the prescribed footprint 250, and may have a minimum line width. In at least one other interconnect layer 210, the interconnect 220 may be generally oriented to run along the Y dimension across the full Y dimension width of the prescribed footprint 250, and may have a minimum line width. The X and Y dimensions of the prescribed footprint 250 may be determined according to the longest interconnect 220 running along the X dimension and the longest interconnect 220 running along the Y dimension in one or more interconnect layers 210 of the spare-stack region 240.

In various embodiments, there may be a different footprint on each horizontal interconnect layer 210, and the footprint of each horizontal interconnect layer 210 may be offset from one another.

Figure 3:
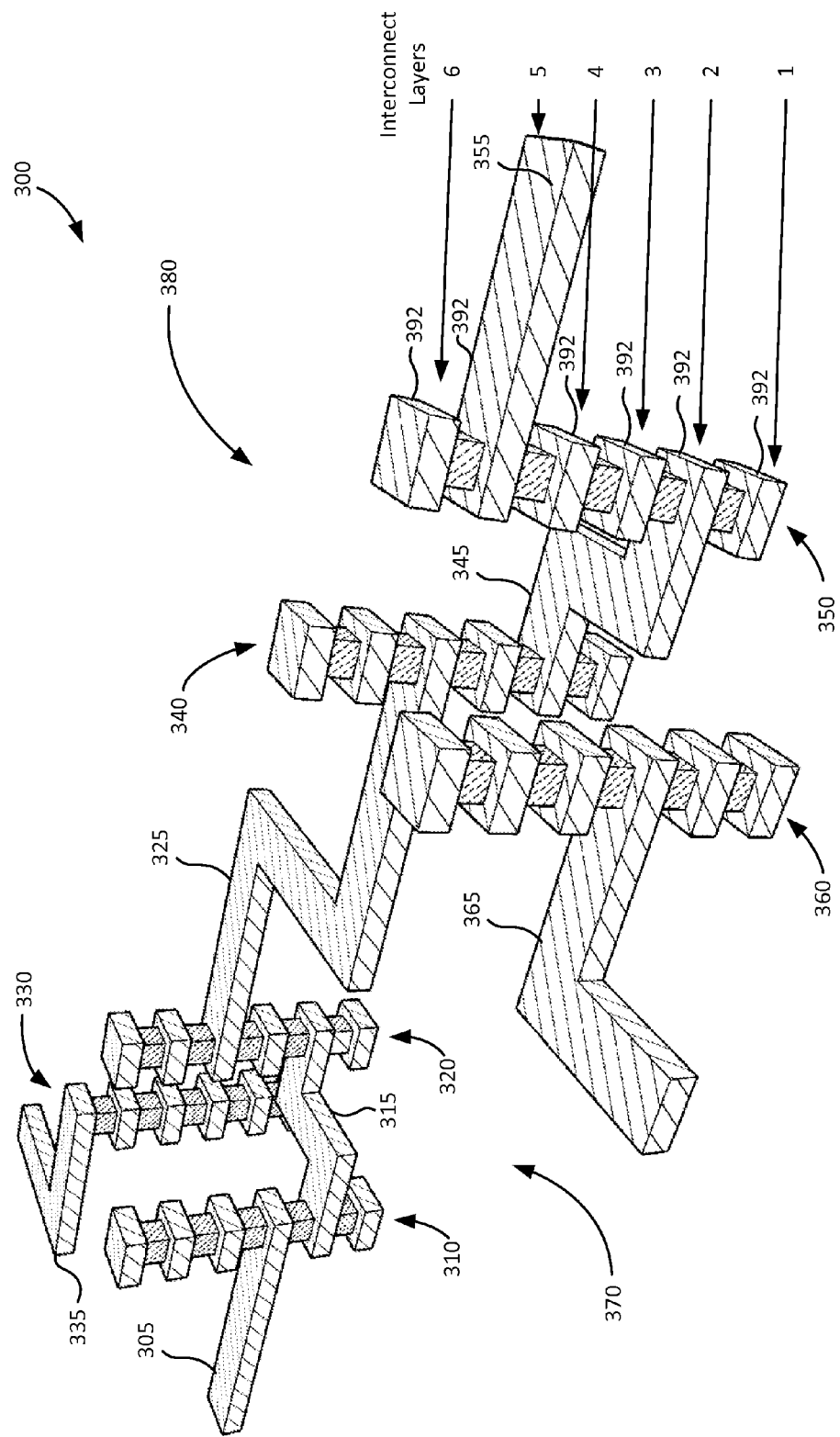
FIG. 3 is a perspective diagram that illustrates a section of an integrated circuit layout containing spare wiring structures, according to an embodiment.

FIG. 3 is a perspective diagram that illustrates a section of an integrated circuit layout 300 containing spare wiring structures, according to an embodiment. In various embodiments, the spare wiring structures may include metallic materials or non-metallic electrically conductive materials. In this example section of the integrated circuit layout 300, spare-stacks 310, 320, 330, 340, 350, and 360 each span six interconnect layers and five via layers. While all of the spare-stacks 310, 320, 330, 340, 350, and 360 in the example embodiment are illustrated as strictly vertically-oriented, spare-stacks are not required to be strictly vertical structures, and in various embodiments include two or more via layers that do not align vertically when fabricated, as illustrated in FIG. 2. A characteristic feature of a spare-stack may be that it spans as many interconnect layers as possible while adhering to a footprint constraint in order to provide connectivity to a spare-route on as many interconnect layers as possible. In some embodiments, this footprint is a fixed constraint. In others, the size of the footprint is determined by the user-defined input, design constraints, logical design-characteristics, and physical design-characteristics. In some embodiments, the footprint constraint varies depending on its location in the design and the run-time progress of the algorithm. In an ideal case, spare-stacks may be strictly vertical and may span all interconnect layers; however, due to routing obstructions, it may not always be possible to construct a strictly vertical spare-stack, nor may it be possible to construct a spare-stack that spans all interconnect layers, while achieving interconnect goals of the integrated circuit's physical design.

In some embodiments, the structure of an individual spare-stack is selected from a library of predefined stack structures or cells. In other embodiments, a method that performs a routing algorithm is used to construct the spare-stack such that the desired vertical span is achieved while adhering to the footprint constraint and avoiding routing obstructions.

For one embodiment of the footprint constraint, all horizontal interconnect layers and via layers of the spare-stack must reside within a prescribed area in a fixed location for all layers. This is called a fixed-area footprint constraint. For another embodiment of the footprint constraint, all routing resources used to construct the spare-stack must reside within a prescribed area, however the location of the prescribed area can change from layer to layer. This is called a floating-area footprint constraint.

For some embodiments, spare-stacks are constructed in conjunction with each other in order to construct a spare-junction. In one embodiment, all spare-stacks are constructed using the same fixed-area footprint constraint. In another embodiment, all spare-stacks are constructed using the same floating-area constraint. In another embodiment, a proximity-template is used on one or more interconnect layers. This proximity-template is used to force the route of each spare-stack in the spare-junction to pass through specific locations defined by the template. The outcome of using this constraint may be that all spare-stacks included in the spare-junction are forced to reside in close proximity to each other for each layer in which the template is applied. In some embodiments, a proximity template may include one or more predefined cells containing a fixed arrangement of one or more of metal wire segments or metal pins on one or more routing layers.

In some embodiments, the components of the spare-stack that reside on metal layers extend beyond their minimum required size in order to help facilitate dividing or disconnecting a portion of the spare-stack from one or more spare-routes when making ECO metal-layer changes and disconnecting from tie-cells or VSS/VDD nets when required by the manufacturing technology.

Specific embodiments of a spare-stack in the physical design of an integrated circuit may vary depending upon one or more of the insertion location within the circuit layout, design constraints, user input, logic-design characteristics, and physical-design characteristics. It may also depend on the user-defined constraints, logical design-constraints, and physical design-constraints.

In the illustrated embodiment, each spare-stack 310, 320, 330, 340, 350, and 360 is connected to at least one spare-route 305, 325, 335, 355, and 365, while some spare-stacks 310, 320, 340, 350 are also connected to an interconnect layer route 315, 345 that is used to connect two spare-stacks for the purpose of connecting two spare-routes. The group of spare-stacks 310, 320, and 330 may be considered a spare-junction 370, while the group of spare-stacks 340, 350, and 360 may be considered a spare-junction 380. Spare-routes may remain unconnected in an initial design of an integrated circuit layout, and later be connected when performing an ECO.

As illustrated, the spare-junction 370 includes a plurality of spare-stacks 310, 320, 330 and the spare-junction 380 includes a plurality of spare-stacks 340, 350, 360. Each of the plurality of spare-stacks 310, 320, 330 340, 350, 360 occupy a portion of more than one adjacent interconnect layer of the plurality of interconnect layers 1, 2, 3, 4, 5, 6. There is one or more unobstructed single-interconnect-layer routing paths (e.g., paths of interconnect layer routes 315 and 345) between each pair of the plurality of spare-stacks 310, 320, 330, 340, 350, 360 comprised by the spare-junctions 370, 380 for at least a prescribed number of interconnect layers. Each of the plurality of spare-stacks 310, 320, 330, 340, 350, 360 includes a plurality of spare electrically conductive interconnect layer structures 392 electrically isolated from the plurality of active electrically conductive interconnect layer structures.

Figure 4:
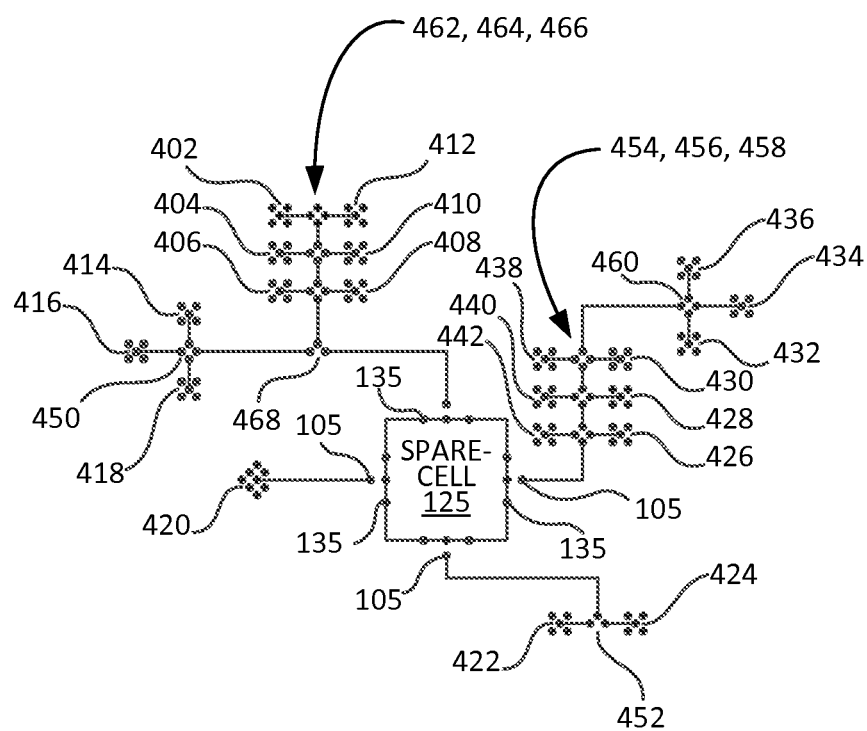
FIG. 4 is a schematic diagram that illustrates spare wiring structures that are inserted into the layout of an example integrated circuit design according to the predicted utility of providing connectivity to a spare-cell at various locations of the integrated circuit layout, according to an embodiment.

FIG. 4 is a schematic diagram that illustrates spare wiring structures that are inserted into the layout of an example integrated circuit design according to the predicted utility of providing connectivity to a spare-cell at various locations of the integrated circuit layout, according to an embodiment. In this example, the access locations (ALs) 105, 402, 404, 406, 408, 410, 412, 414, 416, 418, 420, 422, 424, 426, 428, 430, 432, 434, 436, 438, 440, 442, 444, 450, 452, 454, 456, 458, 460, 462, 464, and 466 are not arranged according to a pattern, and therefore the access location density may vary significantly from one region of the integrated circuit layout to another. In this embodiment, a spare-junction has been inserted at each of the access locations 450, 452, 454, 456, 458, 460, 462, 464, and 466. The spare-junctions at access locations 450, 452, 454, 456, 458, 460, 462, 464, and 466 are arranged to provide increased access between neighboring access locations and spare-routes that connect to the spare-cell 125. Spare-routes and floating spare-stacks are inserted at access locations 402, 404, 406, 408, 410, 412, 414, 416, 418, 420, 422, 424, 426, 428, 430, 432, 434, 436, 438, 440, 442, and 444 in order to provide increased access between circuit elements and either spare-cells or other points of interest within the physical design of the integrated circuit.

Figure 5:
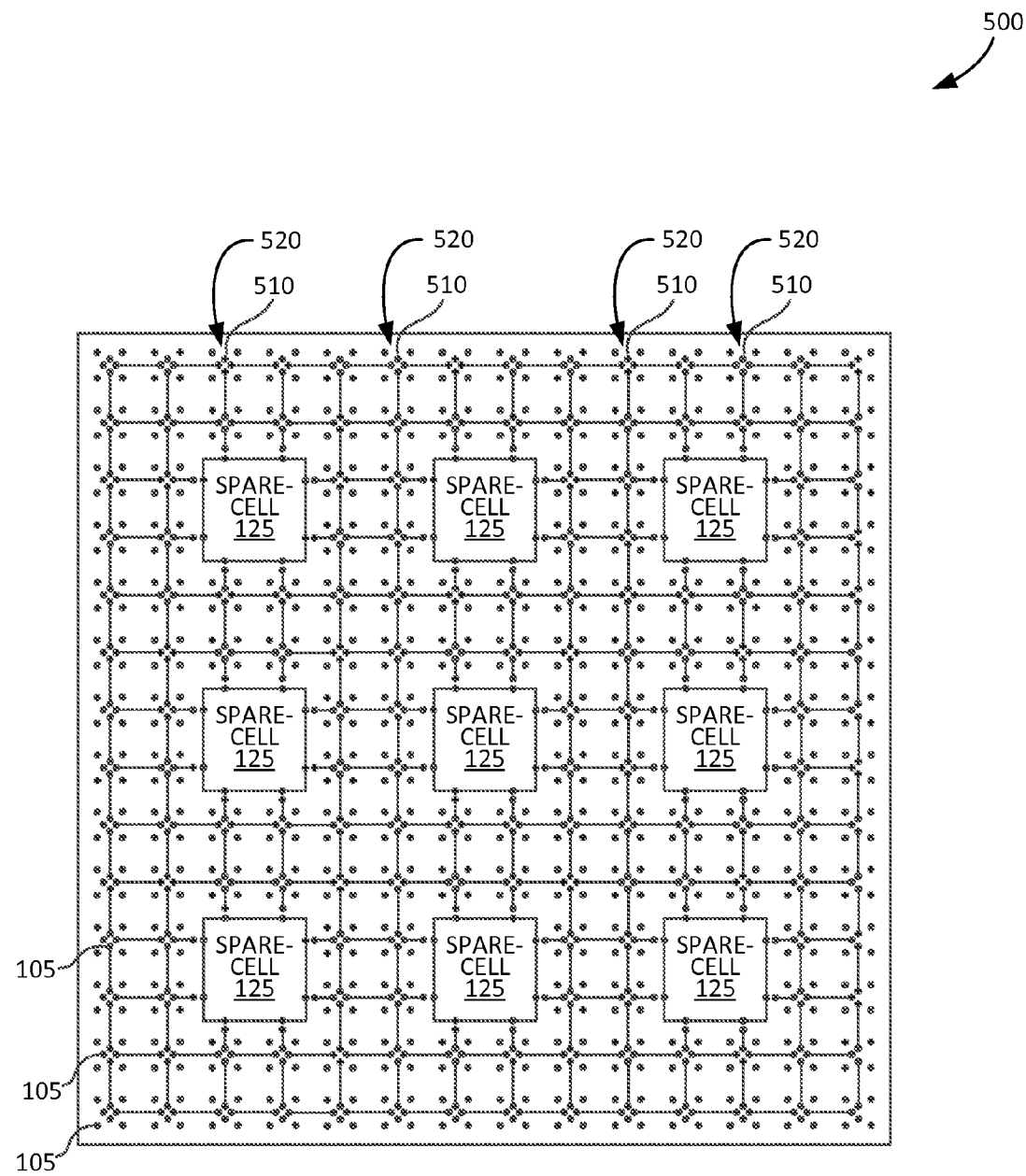
FIG. 5 is a schematic diagram that illustrates an example integrated circuit layout in which spare wiring structures have been inserted by a user or CAD program according to a pattern, according to an embodiment.

FIG. 5 is a schematic diagram that illustrates an example integrated circuit layout 500 in which spare wiring structures have been inserted by a user or CAD program according to a pattern, according to an embodiment. In this example, the inserted spare-junctions 510 and access locations 520 are implemented using the same spare-stacks 105 due to the choice of topology of that has been employed. Such a topology provides a uniform density of access locations 520 throughout the example integrated circuit layout 500.

Figure 6A:
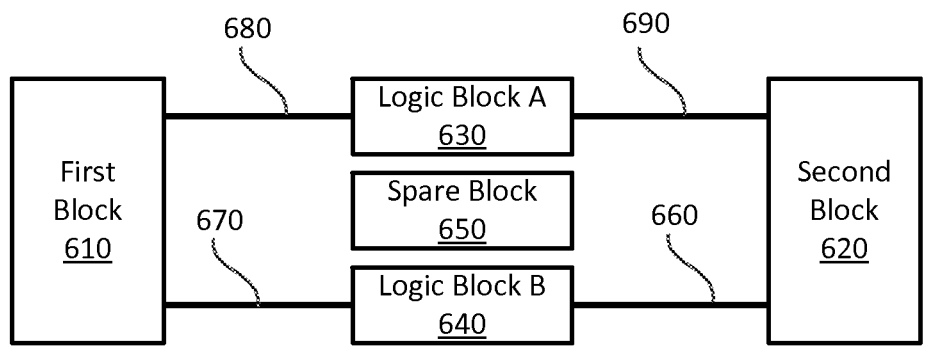
FIGS. 6A and 6B are schematic diagrams that illustrate an example change in logic connections due to an engineering change order of an integrated circuit design.
Figure 6B:
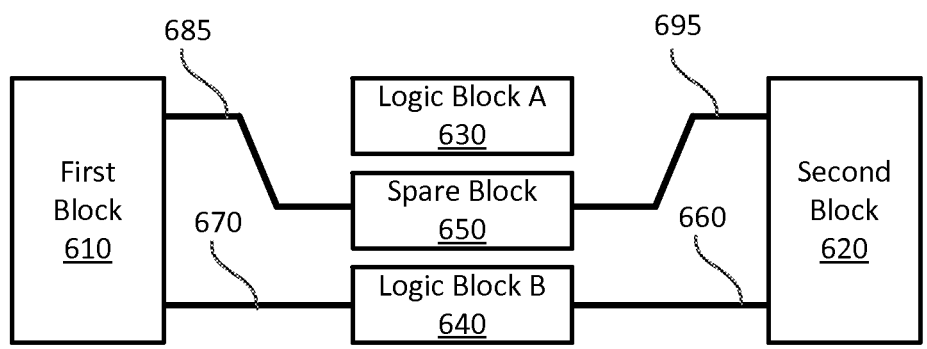

FIGS. 6A and 6B are schematic diagrams that illustrate an example change in logic connections due to an engineering change order of an integrated circuit design. As illustrated in FIG. 6A, a logic block A 630 is connected to a first block 610 through interconnect 680 and a second block 620 through interconnect 690, while a logic block B 640 is connected to the first block 610 through interconnect 670 and the second block 620 through interconnect 660. The first block 610 and the second block 620 each represent a block of logic implemented in an integrated circuit design. The logic block A 630 and the logic block B 640 also each represent a block of logic implemented in an integrated circuit design. A spare block 650 includes logic circuitry that may be used to supplement or replace existing logic circuitry in an integrated circuit design when performing an engineering change of the integrated circuit design.

As an example, if an error is discovered in logic block A 630 after the integrated circuit design is fabricated, an engineering change order may be performed by replacing logic block A 630 with spare block 650. The engineering change order would disconnect interconnect 680 and 690 from logic block A 630, replace the interconnect 680 with interconnect 685 between the first block 610 and the spare block 650, and replace the interconnect 690 with interconnect 695 from the second block 620 to the spare block 650 as illustrated in FIG. 6B.

FIGS. 7A and 7B are schematic diagrams that illustrate a conventional method of performing an engineering change order of an integrated circuit design according to the example change in logic connections of FIGS. 6A and 6B. As illustrated, a high congestion area of interconnect exists in the general vicinity of logic block B 640 in the physical layout of the integrated circuit design. The area may be considered high congestion because the area includes a greater number of electrically active interconnects between active electronic circuit elements per unit area than an average number of electrically active interconnects in the overall integrated circuit. For example, the area may be considered high congestion when the number is greater than 10% more, greater than 20% more, greater than 30% more, greater than 40% more, greater than 50% more, or other measurable and noticeable amount as would be recognized by one of ordinary skill in the art. As a result, when interconnect 680 between the first block 610 and the logic block A 630 is replaced with interconnect 685 between the first block 610 and the spare block 650, five interconnect layers (5, 6, 7, 8, and 9) must be revised in order to route interconnect 685 around the high congestion area, using the conventional method. Because the high congestion area is not present between the spare block 650 and the second block 620, when interconnect 690 between the second block 620 and the logic block A 630 is replaced with interconnect 695 between the second block 620 and the spare block 650, only one interconnect layers (5) must be revised. This is because only the interconnect 690, which is being replaced, passes through the high congestion area, not the new interconnect 695. Each revised interconnect layer results in a need to create a new photomask, which is an expensive process. Unused interconnect or wire is shown in dashed lines attached to the spare block 650 in FIG. 7A, and to disconnected logic block A 630 in FIG. 7B.

FIGS. 8A and 8B are schematic diagrams that illustrate a method of performing an engineering change order of an integrated circuit design according to the example change in logic connections of FIGS. 6A and 6B, using spare-stacks 810 and 820, according to an embodiment. As illustrated, a high congestion area of interconnect exists in the general vicinity of logic block B 640 in the physical layout of the integrated circuit design. As a result, when interconnect 680 between the first block 610 and the logic block A 630 is replaced with interconnect 685 between the first block 610 and the spare block 650, interconnect 685 is made to go around the high congestion area on interconnect layer 9 between the spare-stack 810 and the spare-stack 820. The spare-stacks 810 and 820 may be embodiments of the spare-stack 105 illustrated in FIG. 2 or the spare-stacks 310, 320, 330, 340, 350, and 360 illustrated in FIG. 3. The spare-stack 810 is split into a connected upper spare-stack 812 and an unused lower spare-stack 814, while the spare stack 820 is split into a connected upper spare-stack 822 and an unused lower spare-stack 824, by changing the interconnect within the spare-stacks 810 and 820 on interconnect layer 5. In addition, the portion of interconnect 680 that passes through interconnect layer 5 is rerouted to attach to the upper spare stack 812 rather than the rest of the former interconnect 680 that connected to the logic block A 630 in FIG. 8A (now referred to as unused interconnect 680' in FIG. 8B). Likewise, an unused interconnect connected to spare block 650 is connected to the connected spare stack 822 on interconnect layer 5 to form the rest of the interconnect 685. New interconnect 695 between the second block 620 and the spare block 650 is formed by disconnecting the interconnect 690 at interconnect layer 5 and connecting the portion of the prior interconnect 690 between the second block 620 and interconnect layer 5 with a previously unused interconnect connected to the spare block 650 at interconnect layer 5 to form new interconnect 695 between the second block 620 and the spare block 650. The now disconnected interconnect 690 of FIG. 8A is shown as unused interconnect 690' in FIG. 8B. Using the spare-stacks 810 and 820 of the architecture of spare wiring structures disclosed herein, only two interconnect layers (5, 9) need to be revised in order to accomplish the engineering change of FIGS. 6A and 6B, compared to the five interconnect layers (5, 6, 7, 8, and 9) that must be revised in FIGS. 7A and 7B, using the conventional method. Because the spare-stacks 810 and 820 are already present in the original circuit design illustrated in FIG. 8A, when interconnect 680 between the first block 610 and the logic block A 630 is replaced with interconnect 685 between the first block 610 and the spare block 650 in the engineering change resulting in the layout shown in FIG. 8B, only two interconnect layers (5, 9) must be revised. This is because the spare-stacks 810 and 820 provide already existing but unused paths between the different interconnect layers that are utilized to create the new interconnect 685 in the engineering change to produce the circuit design shown in FIG. 8B. As in FIGS. 7A and 7B, unused interconnect or wire is shown in dashed lines attached to the spare block 650 in FIG. 8A, and to disconnected logic block A 630 in FIG. 8B. Note that where an interconnect is shown passing through but not terminating at a spare-stack, the interconnect is not electrically connected with the spare-stack.

As illustrated, a substrate 830 includes a plurality of electronic devices (e.g., blocks 610, 620, 630, 640), a plurality of active electrically conductive interconnect layer structures (e.g., interconnect 660, 670, 680, 690) disposed on at least one of the plurality of interconnect layers (e.g., layers 1, 2, 3, 4, 5, 6, 7) and electrically coupled with at least one of the plurality of electronic devices (e.g., blocks 610, 620, 630, 640), and a plurality of spare electrically conductive interconnect layer structures (e.g., spare-stacks 810, 820). At least one of the spare electrically conductive interconnect layer structures (e.g., spare-stacks 810, 820) is disposed on the at least one of the plurality of interconnect layers (e.g., layers 1, 2, 3, 4, 5, 6, 7) on which at least one of the plurality of active electrically conductive interconnect layer structures is disposed (e.g., interconnect 660, 670, 680, 690). In the illustrated embodiment, there is no active electrically conductive layer structure between the input/output interconnect (unused interconnect) and the at least one spare electrically conductive interconnect layer structure (spare-stack 820) along at least one path within at least one of the plurality of interconnect layers (e.g., layer 5).

FIGS. 9A and 9B are schematic diagrams that illustrate a method of performing an engineering change order of an integrated circuit design according to the example change in logic connections of FIGS. 6A and 6B, using spare-stacks 910 and 920 and a spare-route 930, according to an embodiment. The spare-stacks 910 and 920 may be embodiments of the spare-stack 105 illustrated in FIG. 2 or the spare-stacks 310, 320, 330, 340, 350, and 360 illustrated in FIG. 3, and the spare-route 930 may be an embodiment of the spare-routes 305, 325, 335, 355, and 365 illustrated in FIG. 3. As illustrated, a high congestion area of interconnect exists in the general vicinity of logic block B 640 in the physical layout of the integrated circuit design. As a result, when interconnect 680 between the first block 610 and the logic block A 630 is replaced with interconnect 685 between the first block 610 and the spare block 650, interconnect 685 is able to go through the high congestion area on spare-route 930 between the spare-stack 910 and the spare-stack 920. The unused spare-route 930 had been placed in the original integrated circuit design shown in FIG. 9A as part of an embodiment of the architecture of spare wiring structures discussed herein. Because the spare-route 930 was already in place through the high congestion area, the engineering change was able to make use of the spare-route 930 to route new connection 685 through the high congestion area by including the spare-route 930 as part of the new connection 685. The spare-stack 910 is split into a connected lower spare-stack 912 and an unused upper spare-stack 914, while the spare stack 920 is split into a connected upper spare-stack 922 and an unused lower spare-stack 924, by changing the interconnect within the spare-stacks 910 and 920 on interconnect layer 5. In addition, the portion of interconnect 680 that passes through interconnect layer 5 is rerouted to attach to the lower spare stack 912 rather than the rest of the former interconnect 680 that connected to the logic block A 630 in FIG. 9A (now referred to as unused interconnect 680' in FIG. 9B). Likewise, an unused interconnect connected to spare block 650 is connected to the connected spare stack 922 on interconnect layer 5 to form the rest of the interconnect 685. New interconnect 695 between the second block 620 and the spare block 650 is formed by disconnecting the interconnect 690 at interconnect layer 5 and connecting the portion of the prior interconnect 690 between the second block 620 and interconnect layer 5 with a previously unused interconnect connected to the spare block 650 at interconnect layer 5 to form new interconnect 695 between the second block 620 and the spare block 650. The now disconnected interconnect 690 of FIG. 9A is shown as unused interconnect 690' in FIG. 9B. Using the spare-stacks 910 and 920 of the architecture of spare wiring structures disclosed herein, in combination with spare-route 930, only one interconnect layer (5) needs to be revised in order to accomplish the engineering change of FIGS. 6A and 6B, compared to the five interconnect layers (5, 6, 7, 8, and 9) that must be revised as illustrated in FIGS. 7A and 7B, using the conventional method, and the two interconnect layers (5, 9) that must be revised as illustrated in FIGS. 8A and 8B using the spare-stacks only. Because the spare-stacks 910 and 920 and the spare-route 930 are already present in the original circuit design illustrated in FIG. 9A, when interconnect 680 between the first block 610 and the logic block A 630 is replaced with interconnect 685 between the first block 610 and the spare block 650 in the engineering change resulting in the layout shown in FIG. 9B, only one interconnect layer (5) must be revised. This is because the spare-stacks 910 and 920 and the spare-route 930 provide already existing but unused paths between the different interconnect layers and different regions of the integrated circuit footprint that are utilized to create the new interconnect 685 in the engineering change to produce the circuit design shown in FIG. 9B. As in FIGS. 7A and 7B, unused interconnect or wire is shown in dashed lines attached to the spare block 650 in FIG. 9A, and to disconnected logic block A 630 in FIG. 9B. Note that where an interconnect is shown passing through but not terminating at a spare-stack, the interconnect is not electrically connected with the spare-stack.

As illustrated in various embodiments, the architecture of spare wiring structures described herein minimize a number of photomasks that need to be changed during the engineering change order compared to prior methods.

Figure 10:
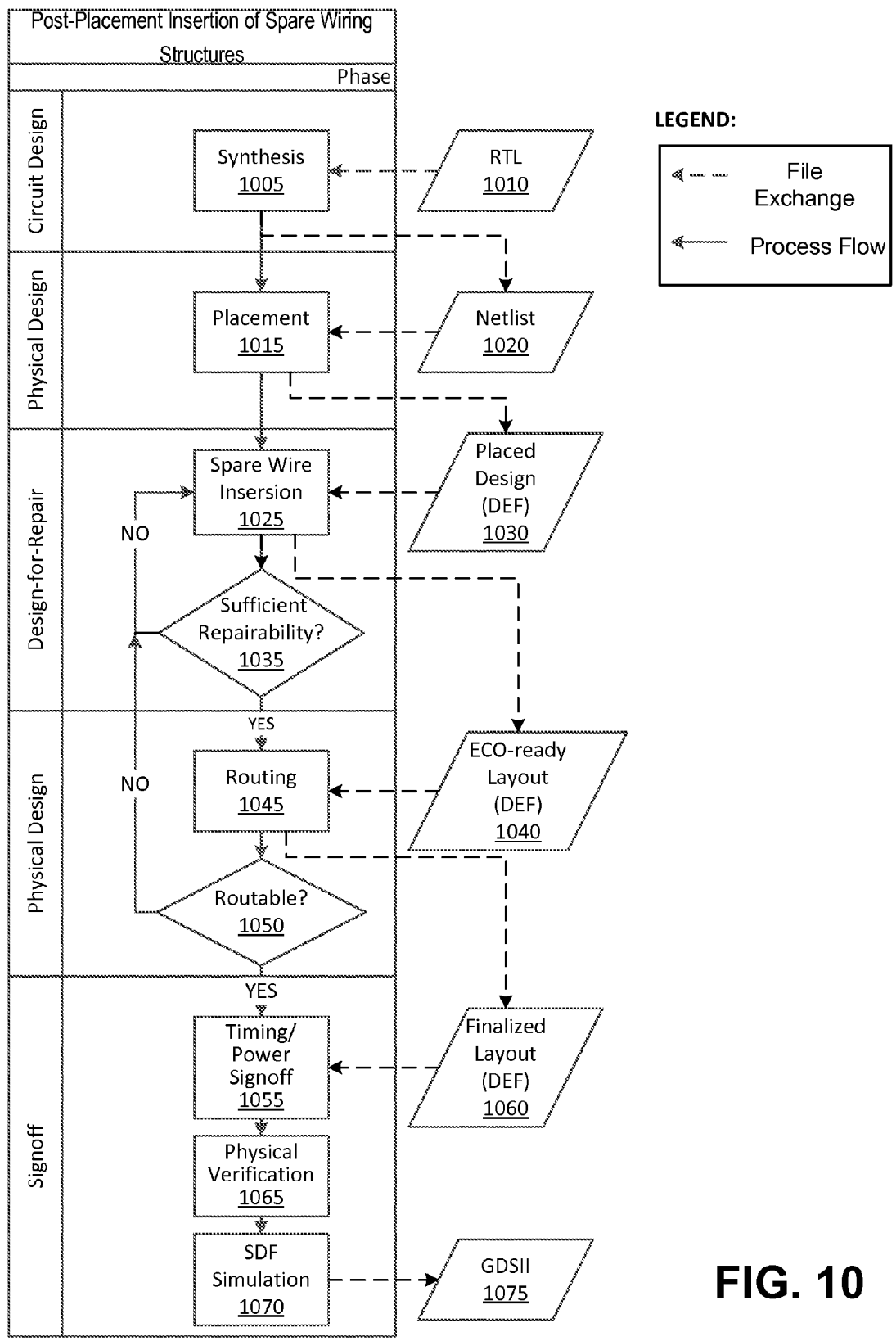
FIG. 10 is a flow diagram that illustrates a design flow for an integrated circuit including post-placement insertion of spare wiring for an architecture of spare wiring structures, according to an embodiment.

FIG. 10 is a flow diagram that illustrates a design flow for an integrated circuit including post-placement insertion of spare wiring for an architecture of spare wiring structures, according to an embodiment. FIG. 10 merely represents one embodiment, and should not be construed as limiting, as the design flow may be modified or supplemented according to the circumstances and requirements of different integrated circuit designs and organizations performing integrated circuit designs without departing from the teachings of the architecture of spare wiring structures disclosed herein.

In the circuit design phase of the post-placement insertion of spare wiring structures design flow, circuit synthesis 1005 is performed using a computer-aided design (CAD) tool for circuit synthesis. The circuit synthesis 1005 takes as an input a register transfer logic (RTL) representation of a circuit design file 1010, and outputs a netlist file 1020. In the physical design phase of the post-placement insertion of spare wiring structure design flow, placement 1015 of circuit elements onto a physical layout of an integrated circuit design is performed using a CAD tool for placement. Placement 1015 takes as an input the netlist file 1020 and outputs a placed design (DEF) file 1030.

In the design-for-repair phase of the post-placement insertion of spare wiring structure design flow, spare wiring insertion 1025 is performed to insert spare wiring structures into the placed design (DEF) file 1030 according to the architecture of spare wiring structures disclosed herein. The spare wiring insertion 1025 may be performed by a CAD tool including modules executable by a processor to take as input a DEF 1030 and insert spare wiring structures according to the architecture of spare wiring structures disclosed herein. The spare wire insertion 1025 outputs an engineering change order (ECO)-ready layout (DEF) file 1040. The ECO-ready DEF 1040 may reduce or minimize a number of photomasks that need to be revised when making an ECO compared to prior methods of design-for-repair, or may produce a better performing or more reliable integrated circuit after the ECO than layouts produced by prior methods of design-for-repair.

In the physical design phase of the post-placement insertion of spare wiring structures design flow, routing 1045 is performed using the ECO-ready DEF 1040 and a finalized layout (DEF) file 1060 is output. The routing 1045 may be performing using a CAD tool. After routing 1045 is performed, it is determined whether the design is routable or not in a decision block 1050. If the design represented in the ECO-ready DEF 1040 is determined to not be routable after performing routing 1045, then the design flow returns to spare wire insertion 1025. In the second and each subsequent attempt at spare wiring insertion 1025, different options and choices may be made to insert spare wiring structures into the integrated circuit design represented by the placed DEF 1030 according to the architecture of spare wiring structures disclosed herein.

In the signoff phase of the post-placement insertion of spare wiring structure design flow, after the ECO-ready DEF 1040 is determined to be routable in decision block 1050, timing/power signoff 1055 is performed using the finalized DEF 1060 produced by routing 1045. Then, physical verification 1065 is performed. CAD tools may be used to perform one or both of the timing/power signoff 1055 and physical verification 1065. After physical verification 1065 is performed, standard delay format (SDF) simulation 1070 is performed using a CAD tool. The output of the SDF simulation 1070 is a GDSII file 1076. The GDSII file 1076 represents a completed integrated circuit design layout according to an industry standard, but this should not be construed as limiting, as other file formats may be used instead to represent the completed integrated circuit design layout.

Figure 11:
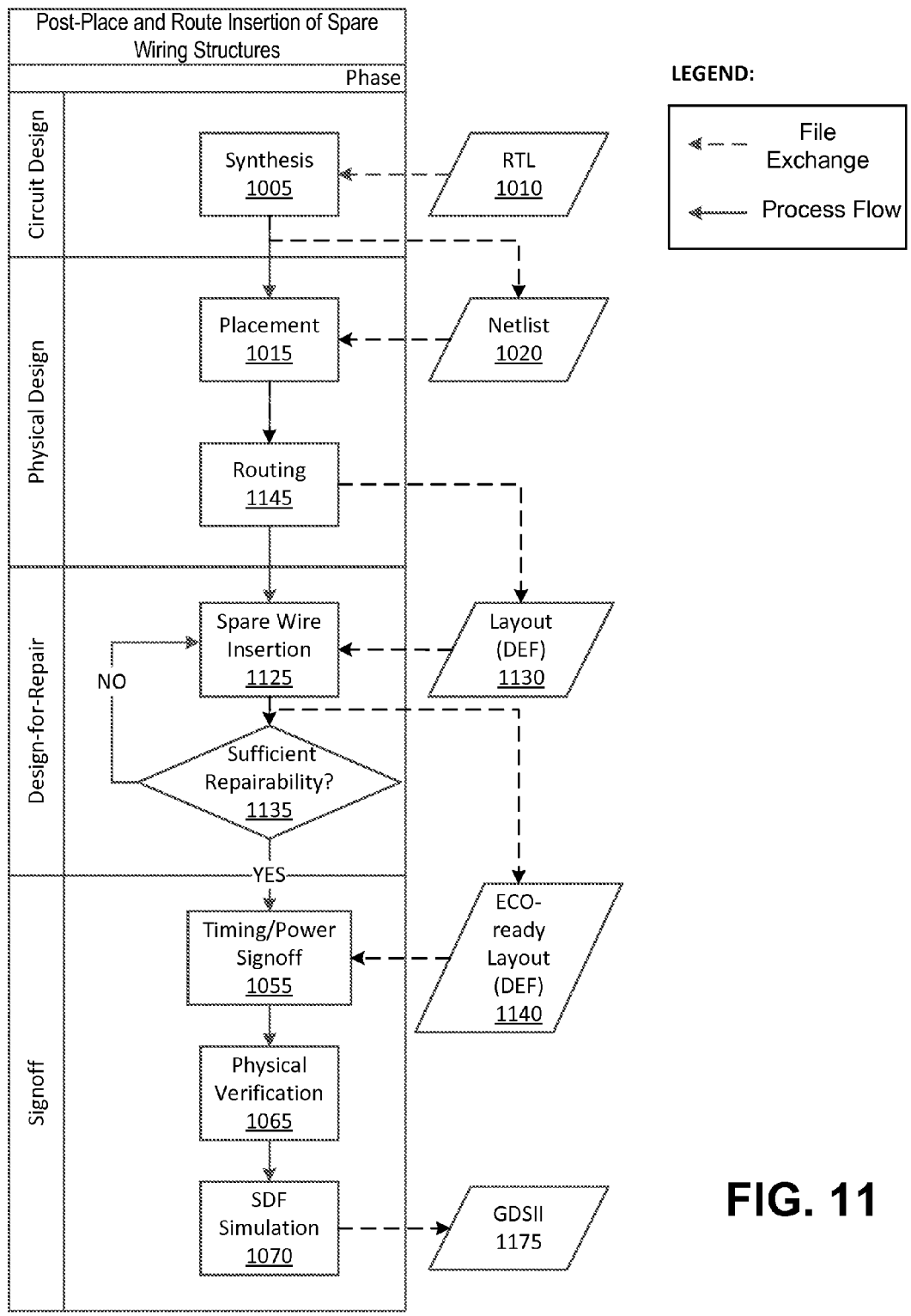
FIG. 11 is a flow diagram that illustrates a design flow for an integrated circuit including post-place and route insertion of spare wiring for an architecture of spare wiring structures, according to an embodiment.

FIG. 11 is a flow diagram that illustrates a design flow for an integrated circuit including post-place and route insertion of spare wiring for an architecture of spare wiring structures, according to an embodiment. FIG. 11 merely represents one embodiment, and should not be construed as limiting, as the design flow may be modified and supplemented according to the circumstances and requirements of different integrated circuit designs and organizations performing integrated circuit designs without departing from the teachings of the architecture of spare wiring structures disclosed herein. The design flow illustrated in FIG. 11 includes elements already discussed with reference to the design flow illustrated in FIG. 10, and therefore the same reference characters have been used for the same elements that appear in both figures and descriptions for elements already discussed are not repeated below. Differences between FIG. 10 and FIG. 11 are primarily described below.

In the post-layout insertion of spare wiring structures design flow of FIG. 11 in contrast to the post-placement insertion of spare wiring structures design flow of FIG. 10, routing 1145 is performed in the physical design phase after placement 1015 is performed. The routing 1145 outputs a layout (DEF) file 1130. The layout (DEF) file 1130 is used as an input to the spare wire insertion 1125 process. In the post-place and route insertion of spare routing design flow of FIG. 11 in contrast to the post-placement insertion of spare wiring structure design flow of FIG. 10, it is not necessary to determine whether routing is possible after performing the spare wire insertion 1125. This is because the routing 1145 is performed before the spare wire insertion 1125, and therefore the spare wire insertion 1125 does not impact whether or not routing 1145 can be performed. Therefore, after it is determined that spare wire insertion 1125 to produce the ECO-ready layout (DEF) 1040 provides sufficient repairability in decision block 1135, the design flow for post-place and route insertion of spare routing proceeds to the signoff phase. In the post-place and route insertion of spare wiring structure design flow of FIG. 11 in contrast to the post-placement insertion of spare wiring structure design flow of FIG. 10, timing/power signoff takes as input the ECO-ready layout (DEF) 1140 produced by spare wire insertion 1125, and the GDSII file 1175 is produced following SDF simulation 1070.

In the post-placement insertion of spare wiring structure design flow of FIG. 10, the design-for-repair phase is situated between two different segments of the physical design phase. In the post-place and route insertion of spare wiring structure design flow of FIG. 10, the design-for-repair phase is situated between the complete physical design phase and the signoff phase. The benefit of the post-place and route insertion of spare wiring structure design flow is that iterations of both spare wire insertions and routing followed by analysis to determine whether the design including the spare wiring structures is routable need not be performed, unlike in the post-placement insertion of spare wiring structure design flow. The benefit of the post-placement insertion of spare wiring structure design flow is that since the spare wiring structures are inserted into the design prior to routing, a more efficient routing that takes into account both the architecture of spare wiring structures and the integrated circuit design may be achieved.

Figure 12A:
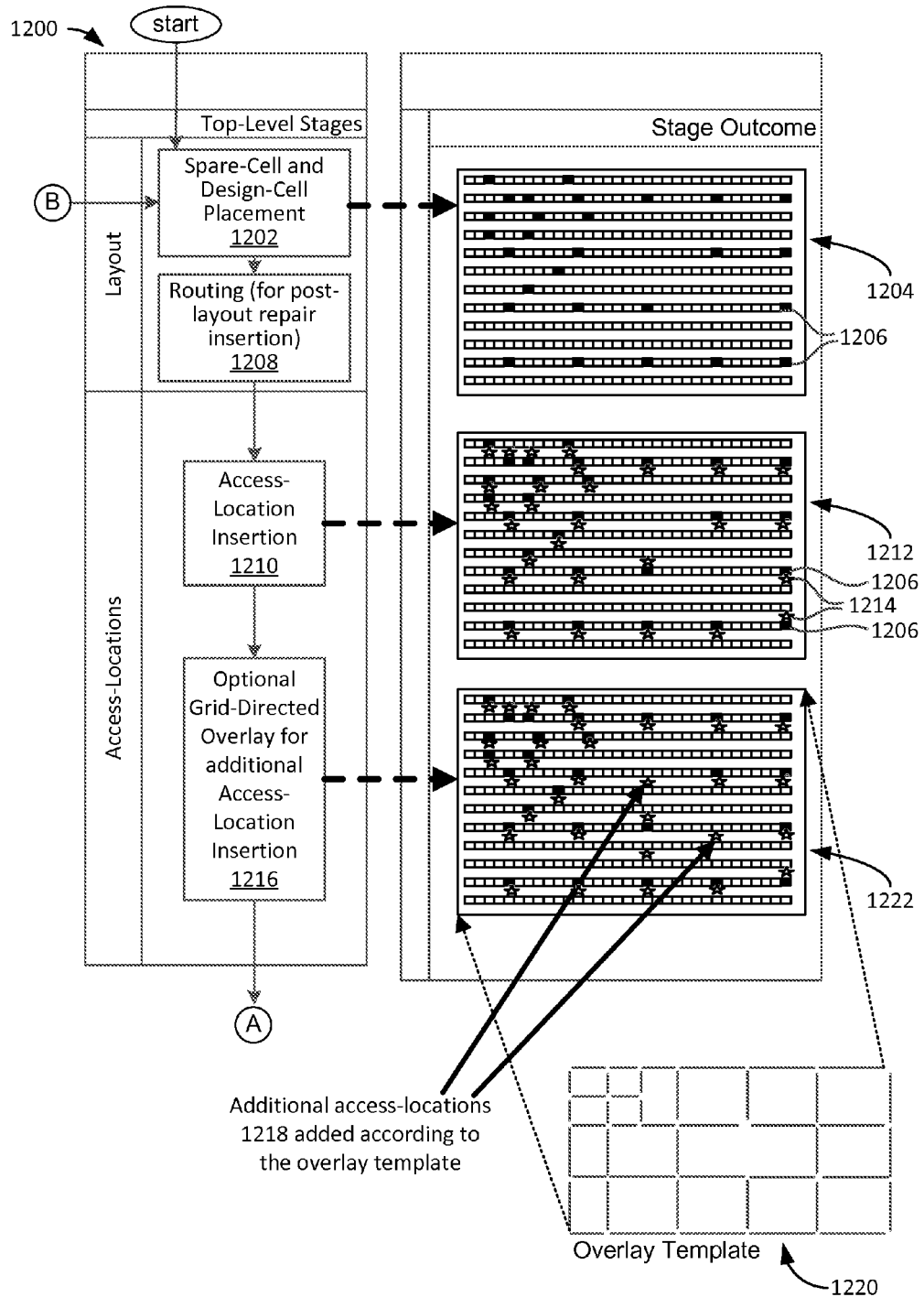
FIGS. 12A and 12B are a flow diagram that illustrates a method of inserting spare wiring structures in an integrated circuit design, according to an embodiment.
Figure 12B:
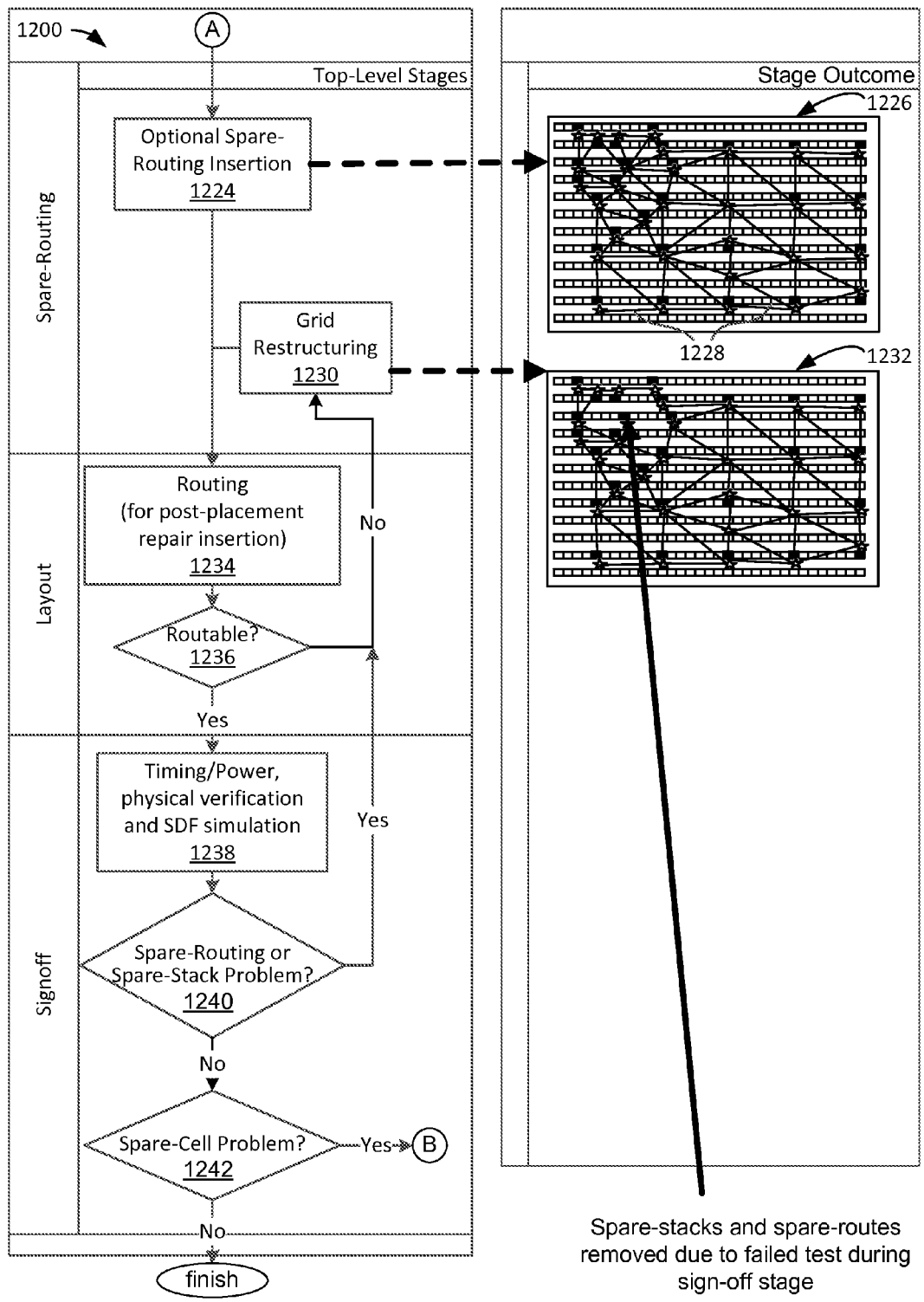

FIGS. 12A and 12B are a flow diagram that illustrates a method 1200 of inserting spare wiring structures in an integrated circuit design, according to an embodiment. FIGS. 12A and 12B represent a single embodiment of the method 1200, with reference characters (A) and (B) enclosed in circles representing a flow of the method 1200 from FIG. 12A to FIG. 12B and vice-versa. In the stage outcome column on the right side of FIGS. 12A and 12B, illustrations of an exemplary integrated circuit layout resulting from each stage of the method 1200, as indicated by dashed arrows, is shown. While the stages of the embodiment are shown in a particular order, this should not be construed as limiting, as in various embodiments, the stages included in the method 1200 and the order of stages may be modified or supplemented according to the circumstances and requirements of different integrated circuit designs and organizations performing integrated circuit designs without departing from the teachings of the architecture of spare wiring structures disclosed herein.

In a place and route stage, spare-cell and design-cell placement 1202 is performed. A CAD tool may be used to perform the placement. An integrated circuit layout 1204 is produced as an output of the placement 1202. Illustrated as black rectangles, spare-cells 1206 may be sprinkled throughout the integrated circuit layout 1204. Following the placement 1202, if a post-place and route insertion of spare wiring structure design flow is being performed, routing 1208 is performed.

In the access-locations stage, access-locations (AL) insertion 1210 is performed. Access location insertion 1210 inserts access-locations 1214 near spare-cells to improve access to spare resources, e.g., spare-cells 1206. Improved access to spare resources facilitates ECOs having a reduced number of photomask revisions or improved performance of the circuit following the ECO compared to conventional approaches to design for repair. A CAD tool may be used to perform the access location insertion 1210. An integrated circuit layout 1212 is produced as an output of the access location insertion 1210. Illustrated as oval black-layered columns, access locations 1214 may be sprinkled throughout the integrated circuit layout 1212 near the spare-cells 1206.

Exemplary pseudocode for a spare-cell access location insertion algorithm to insert access locations 1214 near all spare-cells 1206 to increase accessibility to spare resources follows:

---

1. For all spare-cells
   a. Determine spare-cell coordinate $C_i$
   b. Determine which access-location architecture $A_i$ to use
   c. Determine an offset $\delta_i$
   d. Determine a bounding box $B_i$ of size $\epsilon$ centered at $C_i + \delta_i$
   e. Repeat for max attempts
      i. Attempt insertion for architecture A in bounding-box $B_i$
      ii. If insertion fails
         1. Determine new value for one or more of $A_i$, $\epsilon_i$, and $\delta_i$
      iii. else
         1. exit loop

---

Note regarding line 1(b): access-location architectures may include one or more fixed vertical spare-stacks and routed vertical spare-stacks. Some arrangements may include junction architectures to maximize routing connectivity. Determination of the A is dependent on one or more of the local and/or global design characteristics and constraints of the integrated circuit design, including but not limited to logical design characteristics, physical design characteristics, and physical design constraints.

Possible logical design characteristics include various measures of circuit centrality, timing information, circuit switching or activity information, estimated demand for spare-resources, circuit complexity, circuit confidence level, circuit test coverage, and circuit importance. The logical design characteristics may be considered at a regional level within the logic design of the integrated circuit or for the entirety of the logic design of the integrated circuit. In one embodiment, demand is determined by local and/or global design characteristics, including but not limited to logic complexity, logic structure, logic composition (combinational, sequential), logic status (new, legacy, etc.), and logic test coverage. Possible physical design characteristics include active interconnect congestion, estimated supply of spare-resources, timing information, circuit power information, active interconnect design information, and minimum transistor gate width or line width. The physical design characteristics may be considered at a regional level within the physical design of the integrated circuit or for the entirety of the physical design of the integrated circuit.

Note regarding line 1(e): the number of attempts and the range of values for A, $\epsilon$, and $\delta$ are determined by one or more of the proximity to other access-locations and the local and/or global design characteristics and constraints, which may include but are not limited to logical design characteristics, physical design characteristics, and physical design constraints.

Note regarding line 1(e)(i): in one embodiment, fixed vertical spare-stacks can be inserted using a brute-force approach. For routed vertical spare-stacks, one embodiment for insertion includes a shorted-path route. The shortest-path route can be implemented within the algorithm or by a third-party routing tool.

Following the access location insertion 1210, grid-directed overlay for additional access-location insertion 1216 may optionally be performed. Grid-directed overlay 1216 places access-locations (ALs) 1218 throughout the integrated circuit design according to a template 1220. The access-locations 1218 are placed near circuit elements of the integrated circuit design, as opposed to near spare-cells 1206 as the access locations 1214 are placed. Accordingly, grid-directed overlay 1216 may provide increased accessibility to the integrated circuit design for use in performing ECOs by the additional access-locations 1218 placed throughout the integrated circuit design.

Exemplary pseudocode for an optional grid-directed overlay to insert additional access-locations 1218 in the integrated circuit design follows:

---

1. Determine an access-location grid G based on design
2. For all grid row and column intersection points in G
   a. Determine a bounding box $B_i$ of size $\epsilon_i$
   b. Determine the maximum number of access-locations $N_{max}$ permitted for $B_i$
   c. Determine the number of access-locations Ni currently in Bi
   d. If $N_i$ is less than $N_{max}$ then
      i. Determine which access-location architecture $A_i$ to use
      ii. Repeat for max attempts
         1. Attempt insertion for architecture A in bounding-box $B_i$
         2. If insertion fails
            a. Determine new value for one or more of $\epsilon_i$
         3. else
            a. exit loop

---

Note regarding line 1: Selection of G is based on one or more of the local and/or global design characteristics and constraints, including but not limited to logical design characteristics, physical design characteristics, and physical design constraints. The granularity of the grid may differ for different regions of the grid based on one or more of the local design characteristics and constraints, including but not limited to logical design characteristics, physical design characteristics, and physical design constraints.

Note regarding line 2(a): $\epsilon_i$ is determined by one or more of the proximity to other access-locations and the local and/or global design characteristics and constraints, which may include but is not limited to logical design characteristics, physical design characteristics, and physical design constraints.

Note regarding line 2(b): The value of $N_{max}$ is determined by one or more of the proximity to other access-locations and the local and/or global design characteristics and constraints, which may include but is not limited to logical design characteristics, physical design characteristics, and physical design constraints.

Note regarding line 2(d)(i): Access-location architectures include one or more fixed vertical spare-stacks and routed vertical spare-stacks. Some arrangements include junction architectures to maximize routing connectivity. Determination of the A is dependent on one or more of the local and/or global design characteristics and constraints, including but not limited to logical design characteristics, physical design characteristics, and physical design constraints.

Note regarding line 2(d)(ii): The number of attempts and the range of values of $\epsilon$ is determined by one or more of the proximity to other access-locations and the local and/or global design characteristics and constraints, which may include but are not limited to logical design characteristics, physical design characteristics, and physical design constraints.

Note regarding line 2(e)(ii)(1): In one embodiment, fixed vertical spare-stacks can be inserted using a brute-force approach. For routed vertical spare-stacks, one embodiment for insertion includes a shortest-path route. The shortest-path route can be implemented within the algorithm or by a third-party routing tool.

The grid-of-points approach of the grid-directed overlay 1216 is an exemplary embodiment, and should not be considered limiting, as grid-directed overlay 1216 may be performed using different approaches in various embodiments. More generally, grid-directed overlay 1216 may insert access-locations 1218 throughout various locations in the integrated circuit design according to a template, e.g., the template 1220. Embodiments of the template 1220 may include a grid-of-points or a grid-of-regions with each region calling for a specific value or range of values for density of access-locations 1218. Characteristics of the template 1220 may be determined according to characteristics of the integrated circuit design, the integrated circuit layout, and constraints placed upon either or both of the integrated circuit design and layout. An integrated circuit layout 1222 is produced as an output of the grid-directed overlay 1216, including the access-locations 1218 illustrated near circuit elements of the integrated circuit design sprinkled in the integrated circuit design layout.

Although access location insertion 1210 and grid-directed overlay 1216 are illustrated as being performed in one order in FIG. 12A, this should not be construed as limiting, as in various embodiments, they may be performed in an opposite order. Regardless of which of the two aforementioned steps are performed first, the second of the two steps (1210 or 1216) may take into account the locations of the access locations (1218 or 1214) inserted by the first of the two steps when determining where to insert its own access locations (1214 or 1218). In this way, an access-location density constraint may be adhered to in the access-locations stage of the insertion method 1200.

In the spare-routing stage, spare-routing insertion 1224 may optionally be performed. A CAD tool may be used to perform the spare-routing insertion 1224. An integrated circuit layout 1226 is produced as an output of the spare-routing insertion 1224. Spare-routes 1228 may be inserted into the integrated circuit layout as disclosed herein and as illustrated in the exemplary integrated circuit layout 1226.

During spare-routing insertion 1224, routing connections (e.g., spare-routes 1228) between neighboring access-points (e.g., ALs 1214 and ALs 1218) can optionally be added. An algorithm may be used to insert these connections to improve routability while meeting user-defined constraints. In one embodiment, one such user-constraint is a maximum allowed wire-density. In this embodiment, a mesh generation algorithm based on Delaunay triangulation may be used to insert the spare routing. This approach constructs a grid of triangles with vertices defined by access-points and edges defined by the spare-routing wires between access-points. Edges are selectively removed from the mesh based on one or more of the maximum allowed density of edges in a region, the local and/or global design characteristics, the local and/or global layout characteristics, and the local and/or global design constraints.

In some embodiments, the following set of rules apply to the selective removal of edges:
regions with high routing congestion have a reduced density of spare routing
regions of higher centrality have an increased density of spare routing
regions with a higher predicted need for reparability have an increased density of spare routing Following the optional spare-routing insertion 1224, grid restructuring 1230 may be performed. A CAD tool may be used to perform the grid restructuring 1230. When a spare access-location (e.g., AL 1214 or AL 1218) or spare-routing wire (e.g., spare-route 1228) is found to cause a design error during the sign-off stage (discussed below), the grid of spare resources is modified. In one embodiment, the offending access-location and/or spare-routing wire can be removed. The grid restructuring 1230 may remove some spare-stacks (e.g., spare-stacks at ALs 1214 or ALs 1218) and some spare-routings 1228 as a result of failed tests during the sign-off stage, as the grid restructuring 1230 may be executed if a spare-routing or spare-stack problem is determined to exist in the signoff stage. An integrated circuit layout 1232 is produced as an output of the grid restructuring 1230. As illustrated, the integrated circuit layout 1232 shows some changes in the spare-routing and spare-stacks compared to the integrated circuit layout 1226 due to the grid restructuring 1230.

Following the spare-routing stage, if a post-placement insertion of spare wiring structure design flow is being performed, routing 1234 is performed in another layout stage. If routing 1234 is performed, then a determination is made based on the routing 1234 whether the integrated circuit design including the spare-cells 1206, ALs 1214, ALs 1218, and spare-routes 1228 is routable in step 1236. If it is not routable, the method 1200 returns to grid restructuring 1230 to restructure the integrated circuit design including the spare-cells 1206, ALs 1214, ALs 1218, and spare-routes 1228. If the integrated circuit design including the spare-cells 1206, ALs 1214, ALs 1218, and spare-routes 1228 is determined to be routable, the method 1200 proceeds to the signoff stage. Timing/power, physical verification, and SDF simulation 1238 are first performed. In a step 1240, if a spare-routing or spare-stack problem is determined to exist after the timing/power, physical verification, and SDF simulation 1238 are performed, the method 1200 returns to grid restructuring 1230 to restructure the integrated circuit design including the spare-cells 1206, ALs 1214, ALs 1218, and spare-routes 1228. In a step 1242, if a spare-cell problem is determined to exist after the timing/power, physical verification, and SDF simulation 1238 are performed, the method 1200 returns to spare-cell and design-cell placement 1202 in the initial layout stage. If no problems are detected, then the method 1200 finishes.

The foregoing specification of the embodiments has been described with specific elements. Various modifications and changes may be made to the foregoing specification of the embodiments without departing from their broader spirit and scope. For example, the specific arrangements of the spare wiring structures are purely illustrative. Thus, different or additional configurations may be used alternatively. The specific illustrations of the spare wiring structures are correspondingly only to be regarded as illustrative and not restrictive. Additionally, the term "metal layer" is used to refer to an integrated circuit fabrication layer, possibly but not necessarily constructed either partially or entirely of metal, that is parallel to the base fabrication layers. A "metal layer" is predominantly used to construct interconnect structures, such as wires or "routes", that are aligned in a plane that is parallel to the base fabrication layers. Similarly, the term "via layer" is used to refer to an integrated circuit fabrication layer, possibly but not necessarily constructed either partially or entirely of metal, that is parallel to the base fabrication layers.

A "via layer" is predominantly used to construct interconnect structures, such as wires or "vias", that connect interconnect structures from adjacent metal layers. The term "spare-cells" is used to refer to spare or unused resources in the physical design of an integrated circuit such as transistors or logic gates. Spare-cells are normally used to perform ECOs on both pre- and post-fabrication integrated circuit designs. The term "spare-cell" is not intended to imply a particular implementation of a spare resource, and therefore can apply to standard cell-based spare-cells, metal-configurable gate-array spare-cells, or any other form of spare-resource that can be used to construct or modify circuit elements.

All references, including publications, patent applications, and patents, cited herein are hereby incorporated by reference to the same extent as if each reference were individually and specifically indicated to be incorporated by reference and were set forth in its entirety herein.

For the purposes of promoting an understanding of the principles of the invention, reference has been made to the embodiments illustrated in the drawings, and specific language has been used to describe these embodiments. However, no limitation of the scope of the invention is intended by this specific language, and the invention should be construed to encompass all embodiments that would normally occur to one of ordinary skill in the art. Descriptions of features or aspects within each embodiment should typically be considered as available for other similar features or aspects in other embodiments unless stated otherwise. The terminology used herein is for the purpose of describing the particular embodiments and is not intended to be limiting of exemplary embodiments of the invention. In the description of the embodiments, certain detailed explanations of related art are omitted when it is deemed that they may unnecessarily obscure the essence of the invention.

The apparatus described herein may comprise a processor, a memory for storing program data to be executed by the processor, a permanent storage such as a disk drive, a communications port for handling communications with external devices, and user interface devices, including a display, touch panel, keys, buttons, etc. When software modules are involved, these software modules may be stored as program instructions or computer readable code executable by the processor on a computer-readable media such as non-transitory magnetic storage media (e.g., magnetic tapes, hard disks, floppy disks), non-transitory optical recording media (e.g., CD-ROMs, Digital Versatile Discs (DVDs), etc.), and non-transitory solid state memory (e.g., random-access memory (RAM), read-only memory (ROM), static random-access memory (SRAM), electrically erasable programmable read-only memory (EEPROM), flash memory, thumb drives, etc.). The computer readable recording media may also be distributed over network coupled computer systems so that the computer readable code is stored and executed in a distributed fashion. This computer readable recording media may be read by the computer, stored in the memory, and executed by the processor.

Also, using the disclosure herein, programmers of ordinary skill in the art to which the invention pertains may easily implement functional programs, codes, and code segments for making and using the invention. When the disclosure refers to a computer, processor, module, or tool being used to perform a task, this terminology should be interpreted broadly to also include the computer, processor, module, or tool performing the task, e.g., the task is performed by the computer, processor, or tool.

The invention may be described in terms of functional block components and various processing steps. Such functional blocks may be realized by any number of hardware and/or software components configured to perform the specified functions. For example, the invention may employ various integrated circuit components, e.g., memory elements, processing elements, logic elements, look-up tables, and the like, which may carry out a variety of functions under the control of one or more microprocessors or other control devices. Similarly, where the elements of the invention are implemented using software programming or software elements, the invention may be implemented with any programming or scripting language such as C, C++, JAVA®, assembler, or the like, with the various algorithms being implemented with any combination of data structures, objects, processes, routines or other programming elements. Functional aspects may be implemented in algorithms that execute on one or more processors. Furthermore, the invention may employ any number of conventional techniques for electronics configuration, signal processing and/or control, data processing and the like. Finally, the steps of all methods described herein may be performed in any suitable order unless otherwise indicated herein or otherwise clearly contradicted by context.

For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. The words "mechanism", "element", "unit", "structure", "means", and "construction" are used broadly and are not limited to mechanical or physical embodiments, but may include software routines in conjunction with processors, etc.

The use of any and all examples, or exemplary language (e.g., "such as") provided herein, is intended merely to better illuminate the invention and does not pose a limitation on the scope of the invention unless otherwise claimed. Numerous modifications and adaptations will be readily apparent to those of ordinary skill in this art without departing from the scope of the invention as defined by the following claims. Therefore, the scope of the invention is defined not by the detailed description of the invention but by the following claims, and all differences within the scope will be construed as being included in the invention.

No item or component is essential to the practice of the invention unless the element is specifically described as "essential" or "critical". It will also be recognized that the terms "comprises," "comprising," "includes," "including," "has," and "having," as used herein, are specifically intended to be read as open-ended terms of art. The use of the terms "a" and "an" and "the" and similar referents in the context of describing the invention (especially in the context of the following claims) are to be construed to cover both the singular and the plural, unless the context clearly indicates otherwise. In addition, it should be understood that although the terms "first," "second," etc. may be used herein to describe various elements, these elements should not be limited by these terms, which are only used to distinguish one element from another. Furthermore, recitation of ranges of values herein are merely intended to serve as a shorthand method of referring individually to each separate value falling within the range, unless otherwise indicated herein, and each separate value is incorporated into the specification as if it were individually recited herein.

What is claimed is:

1. An integrated circuit comprising:
  a substrate including a plurality of electronic devices;
  a plurality of interconnect layers disposed on one or both sides of the substrate, the plurality of interconnect layers including horizontal interconnect and vertical-interconnect-access (VIA) layers;
  a plurality of active electrically conductive interconnect layer structures, each of the plurality of active electrically conductive interconnect layer structures disposed on one of the plurality of interconnect layers and electrically coupled with at least one of the plurality of electronic devices; and
  a spare-stack occupying a portion of more than one adjacent interconnect layer of the plurality of interconnect layers, the spare-stack including a plurality of spare electrically conductive interconnect layer structures electrically isolated from the plurality of active electrically conductive interconnect layer structures, the plurality of spare electrically conductive interconnect layer structures including at least one spare electrically conductive interconnect layer structure disposed on one of the plurality of interconnect layers on which at least one of the plurality of active electrically conductive interconnect layer structures are also disposed, the plurality of spare electrically conductive interconnect layer structures disposed on adjacent interconnect layers of the plurality of interconnect layers and electrically coupled with one another using one or more vias between pairs of the plurality of spare electrically conductive interconnect layer structures on adjacent interconnect layers,
  wherein a rectangular footprint of the spare-stack is equal to or greater than two minimum line widths of the plurality of spare electrically conductive interconnect layer structures in each of two orthogonal directions.

2. The integrated circuit of claim 1, wherein each of the plurality of spare electrically conductive interconnect layer structures adhere to a per horizontal-interconnect-layer rectangular footprint in each of two orthogonal directions, where the per horizontal-interconnect-layer footprint is disposed according to at least one physical design characteristic of the integrated circuit selected from the group consisting of active interconnect congestion, estimated supply of spare-resources, circuit timing information, circuit power information, active interconnect design information, and minimum transistor gate width.

3. The integrated circuit of claim 1, further comprising a spare-cell electrically coupled with the spare-stack.

4. The integrated circuit of claim 1, further comprising a plurality of spare-stacks, wherein each of the plurality of spare-stacks is disposed at an access-location, the plurality of access-locations disposed in locations in the plurality of interconnect layers according to a calculated utility of providing access from points of interest in the substrate including the plurality of electronic devices to one or more spare-cells or to other points of interest in the substrate.

5. The integrated circuit of claim 1, further comprising a plurality of spare-stacks, wherein each of the plurality of spare-stacks is disposed at an access-location, the plurality of access-locations disposed in locations in the plurality of interconnect layers according to a pattern to reduce complexity of an engineering change order of the integrated circuit.

6. The integrated circuit of claim 1, further comprising a plurality of spare-stacks, wherein the plurality of spare-stacks are disposed in a corresponding plurality of locations of the plurality of interconnect layers according to at least one logical design characteristic of the integrated circuit selected from the group consisting of a measure of circuit centrality, circuit timing information, circuit switching or activity information, estimated demand for spare-resources, circuit complexity, circuit confidence level, circuit test coverage, and circuit importance when performing an engineering change order.

7. The integrated circuit of claim 1, further comprising a plurality of spare-stacks, wherein the plurality of spare-stacks are disposed in a corresponding plurality of locations of the plurality of interconnect layers according to at least one physical design characteristic of the integrated circuit selected from the group consisting of active interconnect congestion, estimated supply of spare-resources, circuit timing information, circuit power information, active interconnect design information, and minimum transistor gate width.

8. The integrated circuit of claim 1, wherein the one or more vias between pairs of the plurality of spare electrically conductive interconnect layer structures on adjacent horizontal-interconnect-layers are two or more vias disposed between three or more of the plurality of spare electrically conductive horizontal-interconnect-layer structures on adjacent interconnect layers, and the two or more vias are not vertically aligned with one another.

9. The integrated circuit of claim 1, wherein the spare-stack is electrically isolated from the substrate.

10. The integrated circuit of claim 1, wherein the spare-stack is electrically coupled with the substrate.

11. An integrated circuit comprising:
  a substrate including a plurality of electronic devices;
  a plurality of interconnect layers disposed on one or both sides of the substrate, the plurality of interconnect layers including horizontal interconnect and vertical-interconnect-access (VIA) layers;
  a plurality of active electrically conductive interconnect layer structures, each of the plurality of active electrically conductive interconnect layer structures disposed on one of the plurality of interconnect layers and electrically coupled with at least one of the plurality of electronic devices; and
  a spare-stack occupying a portion of more than one adjacent interconnect layer of the plurality of interconnect layers, the spare-stack including a pluralitpare electrically conductive interconnect layer structures electrically isolated from the plurality of active electrically conductive interconnect layer structures, the plurality of spare electrically conductive interconnect layer structures including at least one spare electrically conductive interconnect layer structure disposed on one of the plurality of interconnect layers on which at least one of the plurality of active electrically conductive interconnect layer structures are also disposed, the plurality of spare electrically conductive interconnect layer structures disposed on adjacent interconnect layers of the plurality of interconnect layers and electrically coupled with one another using one or more vias between pairs of the plurality of spare electrically conductive interconnect layer structures on adjacent interconnect layers,
  wherein a dimension of a rectangular footprint of the spare-stack is less than half a distance to a closest neighboring access location in each of two orthogonal directions.

12. The integrated circuit of claim 11, wherein each of the plurality of spare electrically conductive interconnect layer structures adhere to a per horizontal-interconnect-layer rectangular footprint in each of two orthogonal directions, where the per horizontal-interconnect-layer footprint is disposed according to at least one physical design characteristic of the integrated circuit selected from the group consisting of active interconnect congestion, estimated supply of spare-resources, circuit timing information, circuit power information, active interconnect design information, and minimum transistor gate width.

13. The integrated circuit of claim 11, further comprising a spare-cell electrically coupled with the spare-stack.

14. The integrated circuit of claim 11, further comprising a plurality of spare-stacks, wherein each of the plurality of spare-stacks is disposed at an access-location, the plurality of access-locations disposed in locations in the plurality of interconnect layers according to a calculated utility of providing access from points of interest in the substrate including the plurality of electronic devices to one or more spare-cells or to other points of interest in the substrate.

15. The integrated circuit of claim 11, further comprising a plurality of spare-stacks, wherein each of the plurality of spare-stacks is disposed at an access-location, the plurality of access-locations disposed in locations in the plurality of interconnect layers according to a pattern to reduce complexity of an engineering change order of the integrated circuit.

16. The integrated circuit of claim 11, further comprising a plurality of spare-stacks, wherein the plurality of spare-stacks are disposed in a corresponding plurality of locations of the plurality of interconnect layers according to at least one logical design characteristic of the integrated circuit selected from the group consisting of a measure of circuit centrality, circuit timing information, circuit switching or activity information, estimated demand for spare-resources, circuit complexity, circuit confidence level, circuit test coverage, and circuit importance when performing an engineering change order.

17. The integrated circuit of claim 11, further comprising a plurality of spare-stacks, wherein the plurality of spare-stacks are disposed in a corresponding plurality of locations of the plurality of interconnect layers according to at least one physical design characteristic of the integrated circuit selected from the group consisting of active interconnect congestion, estimated supply of spare-resources, circuit timing information, circuit power information, active interconnect design information, and minimum transistor gate width.

18. The integrated circuit of claim 11, wherein the one or more vias between pairs of the plurality of spare electrically conductive interconnect layer structures on adjacent horizontal-interconnect-layers are two or more vias disposed between three or more of the plurality of spare electrically conductive horizontal-interconnect-layer structures on adjacent interconnect layers, and the two or more vias are not vertically aligned with one another.

19. The integrated circuit of claim 11, wherein the spare-stack is electrically isolated from the substrate.

20. The integrated circuit of claim 11, wherein the spare-stack is electrically coupled with the substrate.

21. An integrated circuit comprising:
a substrate including a plurality of electronic devices;
a plurality of interconnect layers disposed on one or both sides of the substrate, the plurality of interconnect layers including horizontal interconnect and vertical-interconnect-access (VIA) layers;
a plurality of active electrically conductive interconnect layer structures, each of the plurality of active electrically conductive interconnect layer structures disposed on one of the plurality of interconnect layers and electrically coupled with at least one of the plurality of electronic devices; and
a spare-junction, the spare junction comprising a plurality of spare-stacks, each of the plurality of spare-stacks occupying a portion of more than one adjacent interconnect layer of the plurality of interconnect layers, there being one or more unobstructed single-interconnect-layer routing paths between each pair of the plurality of spare-stacks comprised by the spare-junction for at least a prescribed number of interconnect layers, each of the plurality of spare-stacks including a plurality of spare electrically conductive interconnect layer structures electrically isolated from the plurality of active electrically conductive interconnect layer structures, the plurality of spare electrically conductive interconnect layer structures including at least one spare electrically conductive interconnect layer structure disposed on one of the plurality of interconnect layers on which at least one of the plurality of active electrically conductive interconnect layer structures are also disposed, the plurality of spare electrically conductive interconnect layer structures disposed on adjacent interconnect layers of the plurality of interconnect layers and electrically coupled with one another using one or more vias between pairs of the plurality of spare electrically conductive interconnect layer structures on adjacent interconnect layers.

22. The integrated circuit of claim 21, wherein the plurality of spare-stacks are disposed in a corresponding plurality of locations of the plurality of interconnect layers according to at least one logic design characteristic of the integrated circuit selected from the group consisting of a measure of circuit centrality, circuit timing information, and estimated demand for spare-resources when performing an engineering change order.

23. The integrated circuit of claim 21, wherein the plurality of spare-stacks are disposed in a corresponding plurality of locations of the plurality of interconnect layers according to at least one physical design characteristic of the integrated circuit selected from the group consisting of active interconnect congestion, estimated supply of spare-resources, and timing information.

24. The integrated circuit of claim 21, wherein the one or more vias between pairs of the plurality of spare electrically conductive interconnect layer structures on adjacent interconnect layers are two or more vias disposed between three or more of the plurality of spare electrically conductive interconnect layer structures on adjacent interconnect layers, and the two or more vias are not vertically aligned with one another.

25. The integrated circuit of claim 21, wherein the plurality of spare-stacks are disposed in a corresponding plurality of locations of the plurality of interconnect layers according to a pre-defined rectangular footprint, where the plurality of spare-stacks are routed such that there exists one or more unobstructed single-interconnect-layer routing paths between each pair of the plurality of spare-stacks comprised by the spare junction for at least a prescribed number of interconnect layers such that each of the routing paths is confined to the pre-defined rectangular footprint.

26. The integrated circuit of claim 25, wherein the pre-defined rectangular footprint of the spare junction is equal to or greater than the largest per horizontal-interconnect-layer minimum line width of the plurality of interconnect layers spanned by the spare junction in each of two orthogonal directions.

27. The integrated circuit of claim 25, wherein a dimension of the pre-defined rectangular footprint of the spare junction is less than half a distance to a closest neighboring access location in each of two orthogonal directions.

28. The integrated circuit of claim 21, wherein the plurality of spare-stacks are disposed in a corresponding plurality of locations of the plurality of interconnect layers according to a pre-defined maximum routing path length, where the plurality of spare-stacks are routed such that there exists one or more unobstructed single-interconnect-layer routing paths between each pair of the plurality of spare-stacks comprised by the junction for at least a prescribed number of interconnect layers such that each of the routing paths is limited in length to the maximum routing path length.

29. The integrated circuit of claim 28, wherein a maximum path-length per interconnect layer of the spare junction is equal to or greater than a horizontal-interconnect-layer minimum line width of the plurality of interconnect layers spanned by the spare-junction in each of two orthogonal directions.

30. The integrated circuit of claim 28, wherein a maximum path-length per interconnect layer of the spare junction is less than or equal to a timing critical-path length of a local clock domain.

31. The integrated circuit of claim 21, wherein the plurality of spare-stacks are disposed in a corresponding plurality of locations of the plurality of interconnect layers, where one or more of the plurality of locations of the plurality of interconnect layers are determined according to pre-defined custom cells, where each custom cell defines a specific arrangement of pins for one of the plurality of horizontal-interconnect-layers through which the plurality of spare-stacks are routed, with each spare-stack being routed through a unique pin of the custom cell.

32. The integrated circuit of claim 21, further comprising a plurality of spare-junctions, wherein each of the plurality of spare junctions is disposed at an access-location, the plurality of access-locations disposed in locations in the plurality of interconnect layers according to a calculated utility of providing access from points of interest in the substrate including the plurality of electronic devices to one or more spare-cells or to other points of interest in the substrate.

33. The integrated circuit of claim 21, further comprising a plurality of spare-junctions, wherein each of the plurality of spare junctions are disposed at an access-location, the plurality of access-locations disposed in locations in the plurality of interconnect layers according to a pattern to reduce complexity of an engineering change order of the integrated circuit.

* * * * *